(12) United States Patent
Blom

(10) Patent No.: US 7,352,166 B1
(45) Date of Patent: Apr. 1, 2008

(54) RESISTANCE RATIO DIGITIZING OHMMETER SYSTEM

(75) Inventor: Eric D. Blom, Wakefield, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 277 days.

(21) Appl. No.: 11/301,480

(22) Filed: Dec. 12, 2005

Related U.S. Application Data

(62) Division of application No. 10/877,390, filed on Jun. 25, 2004, now Pat. No. 6,975,103.

(51) Int. Cl.
*G01R 27/00* (2006.01)
*G01R 31/08* (2006.01)

(52) U.S. Cl. .............. 324/99 D; 324/523; 324/600; 324/607; 324/158.1

(58) Field of Classification Search .............. 324/99 D, 324/712, 750–765, 600, 607
See application file for complete search history.

(56) References Cited

U.S. PATENT DOCUMENTS

| | | | |
|---|---|---|---|
| 3,711,850 A | 1/1973 | Kelly | |
| 3,978,472 A | 8/1976 | Jones | |
| 4,104,578 A | 8/1978 | Thuot | |
| RE31,606 E | 6/1984 | Crosby | |
| 4,636,715 A | 1/1987 | Borkowicz | |
| 5,153,510 A * | 10/1992 | Kominsky | ................ 324/99 D |
| 5,564,831 A | 10/1996 | Bashark | |
| 5,655,305 A | 8/1997 | Fletcher | |
| 5,744,973 A | 4/1998 | Bird | |
| 6,309,099 B1 | 10/2001 | Chang | |
| 6,320,512 B1 | 11/2001 | Nicholson et al. | |
| 6,903,558 B1 * | 6/2005 | Blom et al. | ................ 324/712 |

OTHER PUBLICATIONS

"Differential Input 16-Bit No Latency Delta-Sigma ADC," Linear Technology LTC2433-1 Data Sheet, pp. 1-2 and 7.
"Thermistor-to-Digital Converter," MAXIM, MAX6682 Data Sheet, (2 pages).

* cited by examiner

*Primary Examiner*—Ha Tran Nguyen
*Assistant Examiner*—Emily Y Chan
(74) *Attorney, Agent, or Firm*—Patent Law Group LLP; Carmen C. Cook

(57) ABSTRACT

A digitizing ohmmeter system for providing a digital resistance ratio measurement includes a high impedance current source providing a DC excitation current to an impedance-varying input sensor and a reference resistor and an ADC circuit including a charge-balancing modulator and a digital post processing circuit. The same DC excitation current passes through both the input sensor and the reference resistor. The system utilizes a switched capacitor input stage to sample the voltage across the input sensor and the voltage across the reference resistor to generate an input voltage step and a reference voltage step which are coupled to the modulator of the ADC circuit. The digitizing ohmmeter system thereby realizes fully ratiometric operation such that neither a precise current source nor a precise voltage source is required for accurate resistance ratio measurements and only a stable known reference resistor is necessary for accurate absolute resistance measurements.

8 Claims, 10 Drawing Sheets

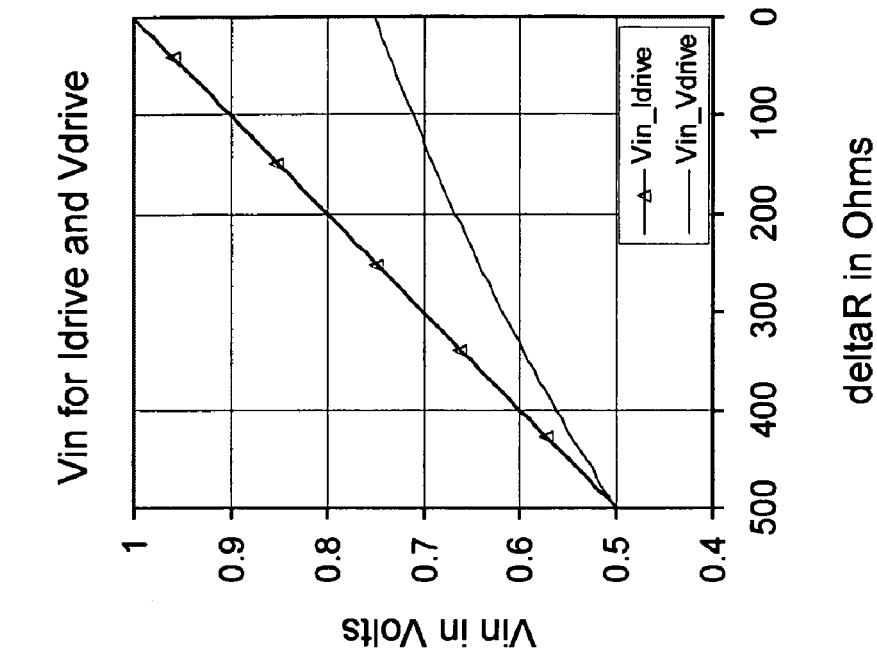
FIG. 9C
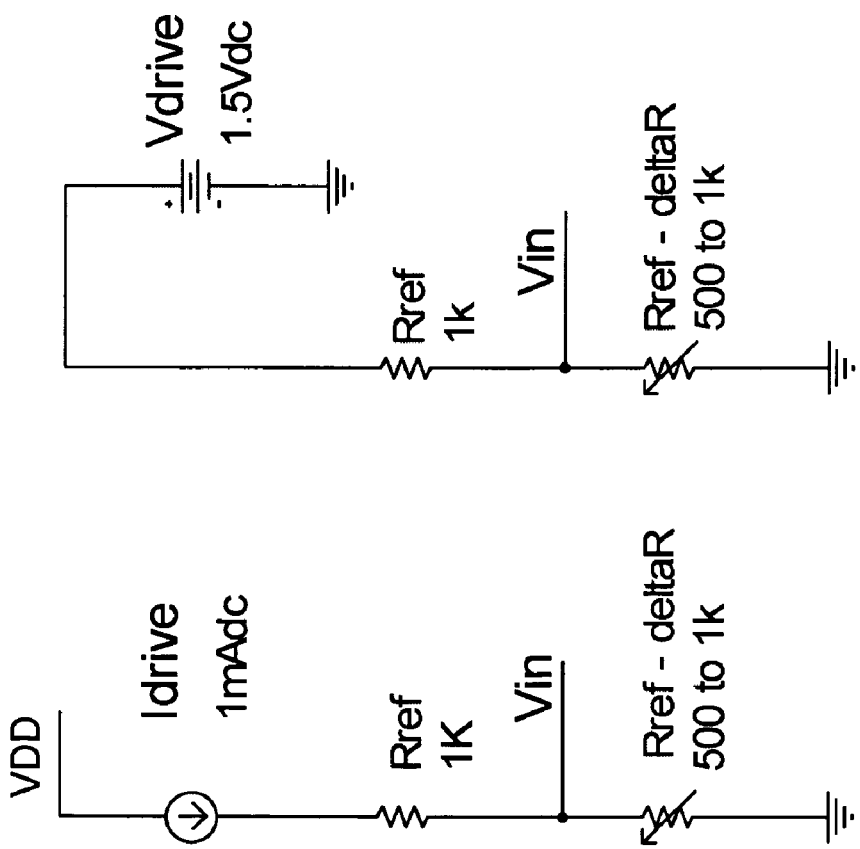
FIG. 9B
FIG. 9A

RESISTANCE RATIO DIGITIZING OHMMETER SYSTEM

CROSS-REFERENCE TO RELATED APPLICATIONS

This application is a divisional of application Ser. No. 10/877,390, filed Jun. 25, 2004, now U.S. Pat. No. 6,975, 103, entitled "Resistance Ratio Digitizing Ohmmeter System" of the same inventors hereof, which application is incorporated herein by reference in its entirety.

FIELD OF THE INVENTION

The invention relates to a resistance ratio measurement system for measuring the ratio of the resistance of a sensor to a reference resistance and converting the ratio measurement to a digital number. In particular, the invention relates to a high precision digitizing resistance measurement system which measures the ratio of an unknown external resistance to a reference resistance.

BRIEF DESCRIPTION OF THE DRAWINGS

FIG. 7 further discloses one method of implementing hyperbolic linearization of the system such that nonlinear errors of the RTD are compensated and the digitized output code more accurately estimates the temperature at the RTD.

FIG. 8 further illustrates one method of compensating for the linearity errors of the thermistor over a limited temperature range.

FIG. 9A is a schematic diagram of a variable resistance sensor configured in a half-Wheatstone bridge configuration with a high impedance current source excitation.

FIG. 9B is a schematic diagram of a variable resistance sensor configured in a half-Wheatstone bridge (voltage divider) configuration with a low impedance voltage source excitation.

FIG. 9C is a plot of the Vin voltage as the resistance of the variable resistance sensor increases from 500 Ohms to 1 kOhms for the resistance sensor configurations in FIGS. 9A and 9B.

DETAILED DESCRIPTION OF THE PREFERRED EMBODIMENTS

In accordance with the principles of the present invention, a ratiometric digitizing ohmmeter system operates to measure the ratio of the resistance of an input sensor to the resistance of a reference resistor and convert the ratio measurement to a digital number. The ratiometric digitizing ohmmeter system includes a single DC current source as the excitation source and a charge balancing analog-to-digital converter (ADC) which utilizes a switched input capacitor and a switched reference capacitor at its input. The DC excitation current passes through both the resistance to be measured (referred to as the "external resistor") and the reference resistance. It is assumed that the reference resistance is of a higher resistance in Ohms than the external resistor. In operation, any change in the DC excitation current affects the voltage signals indicative of the resistance of both of the external and reference resistors proportionally. As a result, a high stability, high precision, high accuracy and low noise digitizing ohmmeter system is realized even when the DC excitation current applied to the reference and external resistors is of low stability, or of low accuracy or controlled to low precision.

The system and method of the present invention can be applied to the indirect measurement of many different types of quantities by choosing an input sensor whose resistance changes in response to the stimulus of interest. For example, temperature can be measured by choosing a resistive thermal device or thermistor as the input sensor, pressure can be measured by choosing a piezoresistive pressure sensor element, ambient light can be measured by choosing a photo-resistive sensor, etc.

Besides resistance measurements, the digitizing ohmmeter system of the present invention can also be used as unipolar voltage-input analog-to-digital converter with external differential voltage reference and input signals. In this application, the excitation current source is not used and a reference voltage is applied to the reference inputs in place of the voltage drop across the reference resistor.

System Overview

Figure 1:
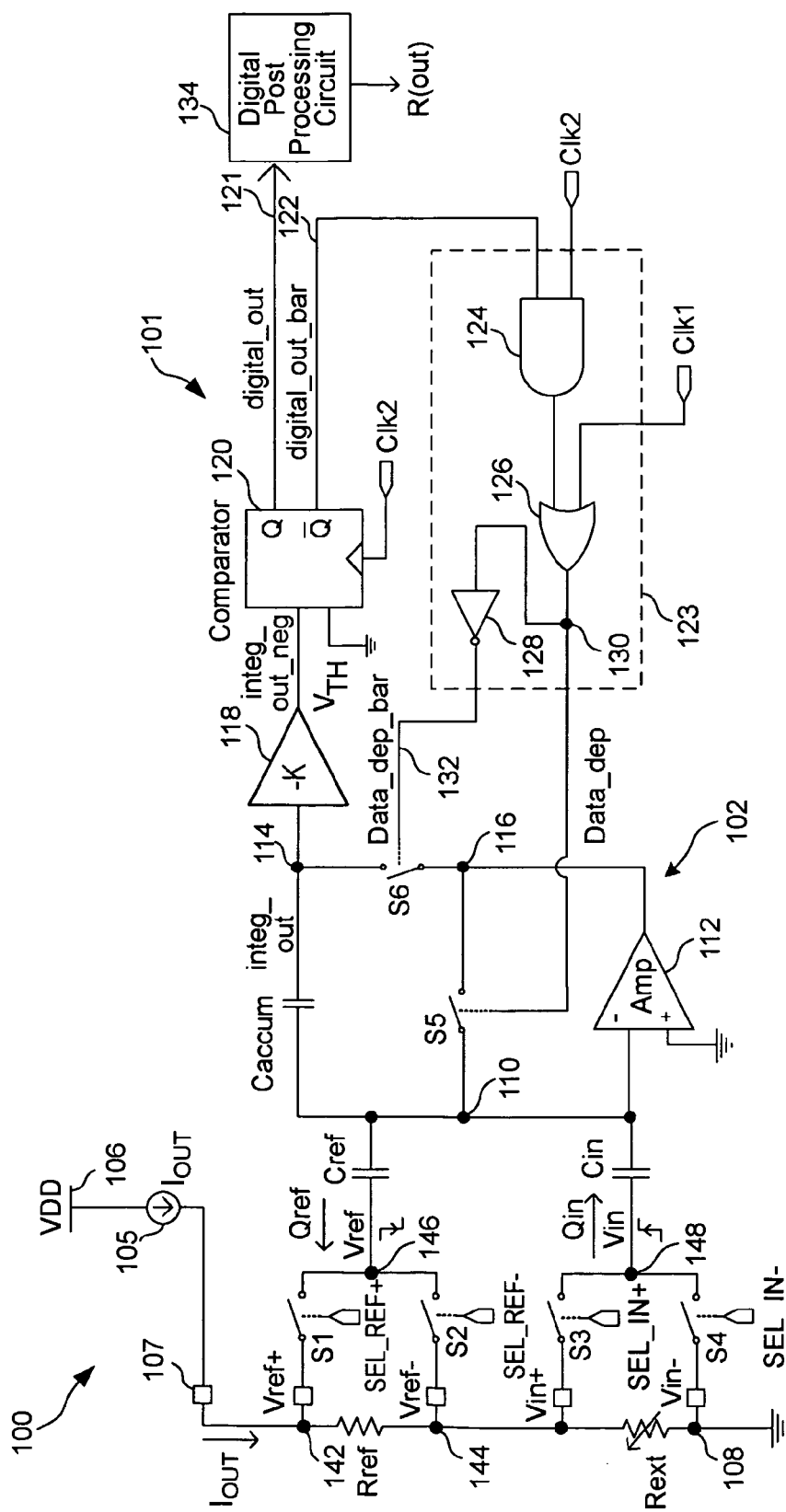
FIG. 1 is a schematic diagram of a resistance ratio digitizing ohmmeter system according to one embodiment of the present invention.

FIG. 1 is a schematic diagram of a ratiometric digitizing ohmmeter system according to one embodiment of the present invention. Generally, digitizing ohmmeter system 100 (hereinafter "system 100") includes a DC excitation source 105 for providing a DC excitation current $I_{OUT}$ for driving both an input sensor (denoted as an external resistor $R_{ext}$) and a reference resistor $R_{ref}$. System 100 also includes an ADC circuit for sampling the input and reference signals and digitizing the signals to provide a digital resistance ratio output signal. The ADC circuit includes a switched capacitor input stage, a charge-balancing modulator 101 and a digital post processing circuit 134. Charge-balancing modulator 101 of the ADC circuit of system 100 includes an integrator 102, a comparator 120 and a logic circuit 123. The charge balancing modulator 101 may optionally include a high input impedance inverting amplifier 118 in series with comparator 120 if the comparator itself does not exhibit the necessary high input impedance or signal inversion.

Referring to FIG. 1, digitizing ohmmeter system 100 is configured to sample and digitize an analog input signal generated by a resistance-varying input sensor in response to its stimulus. In the present embodiment, the resistance-varying input sensor is denoted by a variable external resistor $R_{ext}$. Resistor $R_{ext}$ may be an input sensor external to the integrated circuit in which system 100 is formed, or may be a variable resistance sensor fabricated on the same integrated circuit. Similarly, Rref may be a reference resistor external to the integrated circuit in which 100 is formed or may be a reference resistor fabricated on the same integrated circuit. In general, system 100 can operate to measure an input sensor's response to the intended stimulus which response corresponds to a change in the resistive or the "real" portion of the sensor's impedance.

In the present embodiment, a current source 105 is coupled between the Vdd supply voltage (node 106) and a current output node 107 to provide a source of DC excitation current $I_{OUT}$ to node 107. Current source 105 can be implemented as any conventional current source and does not have to generate a very precise output current $I_{OUT}$. The application of the DC excitation current $I_{OUT}$ to resistor $R_{ref}$ generates a reference voltage Vref across the reference resistor. The value of reference voltage Vref=$I_{OUT}$*$R_{ref}$ needs only to remain within a range defined by some minimum value related to the residual noise and DC offset error of the modulator and below a maximum value above which clipping of analog signals at the integrator output would begin to occur. In the present embodiment, current source 105 provides a 60 µA DC current to output node 107 and clipping does not occur for Vref less than 0.36 Volts. Thus the value for Iout chosen for the present embodiment is optimal for measuring resistances less than 0.36V/60 uA=6 kOhms. Choosing an increased or decreased nominal magnitude for Iout will result in proportional changes to the maximum fullscale resistance measuring range. External circuitry which amplifies or attenuates Iout before application to the reference resistor will similarly scale the measurement range.

As discussed above, digitizing ohmmeter system 100 of the present invention measures the resistance of the input sensor by comparing the resistance of resistor $R_{ext}$ to the resistance of reference resistor $R_{ref}$. In system 100, reference resistor $R_{ref}$ and external resistor $R_{ext}$ (representing the resistance of the input sensor) are connected in series between current output node 107 and the ground voltage (node 108). Thus, the DC excitation current $I_{OUT}$ flows through both reference resistor $R_{ref}$ and external resistor $R_{ext}$ continuously and at the same time. The voltages developed across reference resistor $R_{ref}$ and external resistor $R_{ext}$ as a result of the excitation current $I_{OUT}$ are sampled by the switched capacitor input stage of the ADC circuit of system 100 to provide the analog input signals indicative of the reference resistance and the resistance to be measured.

In system 100, the switched capacitor input stage of the ADC circuit includes switches S1 and S2 for measuring the voltage across resistor $R_{ref}$. Switches S1 and S2 are coupled to a reference capacitor $C_{ref}$ for alternately charging capacitor $C_{ref}$ to generate a reference charge packet Qref. The switched capacitor input stage of the ADC circuit also includes switches S3 and S4 for measuring the voltage across resistor $R_{ext}$. Switches S3 and S4 are coupled to an input capacitor $C_{in}$ for alternately charging capacitor $C_{in}$ to generate an input charge packet Qin.

The operation of ratiometric digitizing ohmmeter system 100 to measure the ratio of the resistance of resistor $R_{ext}$ to the resistance of resistor $R_{ref}$ will now be described in brief. Referring to FIG. 1, in digitizing ohmmeter system 100, the not-necessarily-precise excitation current $I_{OUT}$ is used to excite the input sensor (resistor $R_{ext}$) and the reference resistor ($R_{ref}$) and the switched capacitor input stage of the ADC circuit samples the differential voltage across the input sensor and the differential voltage across the reference resistor, both generated by the excitation current. Specifically, the excitation current $I_{OUT}$ causes a voltage drop across external resistor $R_{ext}$ and the switched capacitor input stage converts the voltage drop to a proportional input charge packet. The excitation current $I_{OUT}$ also causes a voltage drop across reference resistor $R_{ref}$ and the switched capacitor input stage converts the voltage drop to a proportional reference charge packet.

In operation, input capacitor $C_{in}$ is switched from a first input voltage level Vin− to a second input voltage level Vin+ to generate input charge packet Qin having an amplitude given as:

$$Q_{in} = C_{in}(V_{in+} - V_{in-}).\qquad\text{Eq. (1)}$$

The input charge packet Qin is applied to the inverting input terminal of an amplifier 112 in integrator 102 and the charge packet is accumulated in a capacitor Caccum of the integrator.

Reference capacitor $C_{ref}$ is switched from a first reference voltage level Vref+ to a second reference voltage level Vref− to generate reference charge packet Qref having an amplitude given as:

$$Q_{ref} = C_{ref}(V_{ref-} - V_{ref+})\qquad\text{Eq. (2)}$$

Note that the sign of reference charge packet Qref is the opposite of the sign of input charge packet Qin. The reference charge packet Qref is applied to the inverting input terminal of amplifier 112 in integrator 102 during every cycle, but its charge is accumulated in capacitor Caccum in a data dependent manner to balance the series of input charge packets.

When digitizing ohmmeter system 100 is operated over a number of sampling cycles, the DC voltage drop across external resistor $R_{ext}$ is converted to a series of input charge packets Qin by the use of switched capacitor $C_{in}$. The DC voltage drop across reference resistor $R_{ref}$ is converted to a series of reference charge packets Qref by the switched capacitor $C_{ref}$. The charge balancing ADC circuit determines the number of reference charge packets, $N_{ref}$, needed to balance the input charge packets over a full conversion period. The number of reference charge packets, when divided by the number of input charge packets, $N_{tot}$, which were taken during the conversion period is a measurement of the ratio of the external resistance to the reference resistance, as given in Equation (3) below:

$$\frac{R_{ext}}{R_{ref}} = \frac{N_{ref}}{N_{tot}} \quad\text{and}\quad R_{ext} = \frac{R_{ref} N_{ref}}{N_{tot}}.\qquad\text{Eq. (3)}$$

The charge balancing modulation system of the ADC circuit balances the series of input charge packets with the series of reference charge packets to provide a 1-bit data stream as the output signal. When the 1-bit data stream is digitally accumulated by the digital post processing circuitry, a multi-bit digital number indicative of the resistance measured by the system is provided. For the charge balancing ADC circuit employed in the digitizing ohmmeter system of the present invention, the ones density of the 1-bit data stream generated by the modulation system is the ratio of the ADC input charge to the fullscale reference charge over the measured time interval. Because the input charge is directly proportional to the resistance at the input excitation, and the reference charge is directly proportional to the resistance across the reference inputs, the ones density of the 1-bit data stream is also the ratio of the input resistance to be measured to the fullscale reference resistance value.

Detailed System Description

Referring to FIG. 1, the analog signals applied to system 100 include reference voltages Vref+ and Vref− and input voltages Vin+ and Vin−. The voltages are assumed to be DC levels or voltages which change only slowly with respect to the chosen ADC conversion time. The difference between voltages Vin+ and Vin− is converted to a positive-going voltage step of amplitude (Vin+−Vin−) at node 148 by the action of switches S3 and S4. Similarly, the difference between voltages Vref+ and Vref− is converted to a negative-going voltage step of amplitude (Vref−−Vref+) at node 146 by the action of switches S1 and S2. The voltage steps are coupled to the input node of integrator 102 through the switched capacitor input stage to provide corresponding charge packets for use in the charge balancing operation of the ADC.

In the switched capacitor input stage, the first terminal of resistor $R_{ref}$ (denoted as node 142) is coupled to reference capacitor $C_{ref}$ through switch S1 while the second terminal of resistor $R_{ref}$ (node 144) is coupled to reference capacitor $C_{ref}$ through switch S2. Switch S1, controlled by a signal SEL_REF+, is coupled to sample voltage Vref+ of resistor $R_{ref}$. On the other hand, switch S2, controlled by a signal SEL_REF−, is coupled to sample voltage Vref− of resistor $R_{ref}$. In the present illustration, because current $I_{OUT}$ flows from the first terminal (node 142) to the second terminal (node 144) of resistor $R_{ref}$, voltage Vref+ is more positive than voltage Vref−. The signals SEL_REF+ and SEL_REF− are complementary signals that are asserted sequentially so that only one of switches S1 and S2 is closed at a time. Switches S1 and S2 are closed in sequence to sample the voltage across reference resistor $R_{ref}$. The switching action of switches S1 and S2 generates the reference charge packet Qref=$C_{ref}$*(Vref−−Vref+), indicative of the differential voltage value across resistor $R_{ref}$ as a result of the application of the DC excitation current $I_{OUT}$. The reference voltage step Vref is generated at a node 146 which is the first plate of capacitor $C_{ref}$. The reference voltage step Vref is coupled through capacitor $C_{ref}$ to an input node 110 of integrator 102 and a reference charge packet Qref is thus provided to node 110 as a result of the switching action of switches S1 and S2.

The input voltage step Vin is generated in a similar manner to that of the reference voltage step Vref. The first terminal of resistor $R_{ext}$ (node 144) is coupled to input capacitor $C_{in}$ through switch S3 while the second terminal of resistor $R_{ext}$ (node 108) is coupled to input capacitor $C_{in}$ through switch S4. Switch S3, controlled by a signal SEL_IN+, is coupled to sample voltage Vin+ of resistor $R_{ext}$. Similarly, switch S4, controlled by a signal SEL_IN−, is coupled to sample voltage Vin− at resistor $R_{ext}$. In the present illustration, voltage Vin+ is more positive than voltage Vin−. The signals SEL_IN+ and SEL_IN− are complementary signals that are asserted sequentially so that only one of switches S3 and S4 is closed at a time. Switches S3 and S4 are closed in sequence to sample the voltage across external resistor $R_{ext}$. The switching action of switches S3 and S4 generates the input voltage step Vin indicative of the differential voltage value across resistor $R_{ext}$ as a result of the application of the DC excitation current $I_{OUT}$. The input voltage step Vin is generated at a node 148 which is the first plate of capacitor $C_{in}$. The input voltage step Vin is coupled through capacitor $C_{in}$ to input node 110 of integrator 102 and an input charge packet Qin=$C_{in}$*(Vin+−Vin−) is thus provided to input node 110 as a result of the switching action of switches S3 and S4.

In operation, signals SEL_REF+, SEL_REF− SEL_IN+ and SEL_IN− are asserted in a sequential manner to sample the voltages at the two terminals of the two resistors. The switching actions of switches S1 to S4 result in the generation of the reference voltage step Vref and the input voltage step Vin. The capacitance value of capacitor $C_{ref}$ determines the ADC input fullscale range in the charge domain by setting the amplitude of the reference charge packet Qref=$C_{ref}$*(Vref−−Vref+). The value of capacitor $C_{in}$ determines the magnitude of the input charge packet Qin=$C_{in}$*(Vin+−Vin−). While the values of capacitors Cin and Cref need not be the same, choosing Cin=Cref is a simplifying and useful choice. If Cin=Cref, then the fullscale input voltage range at of input voltage step Vin (Vin+−Vin−) will exactly equal the reference voltage step Vref (Vref+−Vref−). Also, in an integrated circuit implementation, the best capacitor value matching and ratio stability occurs for capacitors of equal value. In the present embodiment, capacitors $C_{ref}$ and $C_{in}$ are each a 2 pF capacitor.

The input voltage step Vin, generated by the DC excitation current $I_{OUT}$ flowing through resistor $R_{ext}$ and the sampling of the voltage across resistor $R_{ext}$ using switched capacitor $C_{in}$, is indicative of the resistance of resistor $R_{ext}$. Similarly, the reference voltage step Vref, generated by the DC excitation current $I_{OUT}$ flowing through resistor $R_{ref}$ and the sampling of the voltage across resistor $R_{ref}$ using switched capacitor $C_{ref}$, is indicative of the resistance of resistor $R_{ref}$. The analog input signals to system 100 can also be expressed as the charge packets corresponding to the charge associated with the periodic voltage steps. Thus, input charge packet Qin corresponding to the charge associated with the periodic input voltage step Vin is generated at node 110 as a result of the coupling of voltage step Vin through capacitor $C_{in}$ to the ADC circuit. The input current $I_{in}$ flowing through capacitor $C_{in}$ is given by the magnitude of the periodic input charge packet Qin divided by the sample period. Reference charge package Qref corresponding to the charge associated with the periodic reference voltage step Vref is generated at node 110 as a result of the coupling of voltage step Vref through capacitor $C_{ref}$ to the ADC circuit. The operational of the digitizing ohmmeter system of the present invention will be described in more detail below.

In digitizing ohmmeter system 100, the fullscale resistance range is established by the value of the reference resistance. The corresponding reference voltage range is established by the value of the DC excitation current times the reference resistance. In all embodiments there will exist a maximum voltage range related to the power supply voltages available and the amount of voltage swing which can be obtained at the integrator output without clipping. In one embodiment, which utilizes a supply voltage of 2.4 volts, the maximum input range over process changes and temperature is 0.36 volts. In the present embodiment, the output current $I_{OUT}$, which passes through resistors Rref and Rext is 60 uA. Thus, in the present embodiment, the maximum resistance which can be measured is 0.36 Volts/60 uA=6 kOhms. One ordinarily skilled in the art would appreciate that either external circuitry can be added to reduce or increase the current through the reference resistor and external resistor or the internal current source can be designed to produce reduced or increased current as current $I_{OUT}$ for realizing a system which measured other resistance ranges. For example, an external circuit which amplifies the dc current from 60 uA to 901.5 uA is used in one application where the digitizing ohmmeter system of the present invention is applied to a Resistive Thermal Device (See FIG. 7). If the current through the reference resistor and external resistor was reduced to 6 uA, then system 100 will measure resistances as large as 60 kOhms. Alternately, if current $I_{OUT}$ is increased to 600 uA, then system 100 will measure resistances from 0 to 600 Ohms.

The reference charge packet, Qref, is established by the differential reference voltage range times the value of Cref. A corresponding fullscale reference current can be defined using the reference charge packet. Specifically, the fullscale reference current $I_{ref}$ is given by the magnitude of the periodic reference charge packet Qref divided by the sample period.

The switching action of switches S3 and S4 operates to generate the analog input voltage step Vin indicative of the unknown resistance of resistor $R_{ext}$. The analog input voltage step Vin together with the analog reference voltage step Vref are coupled to modulator 101 of the ADC circuit of system 100 to be sampled and digitized. In the present embodiment, the input voltage step Vin and the reference voltage step Vref are generated by using a switched capacitor circuit to sample the differential voltage across each respective resistor. The voltage steps are then coupled through their respective capacitors ($C_{in}$ or $C_{ref}$) to the ADC circuit. Accordingly, only the difference in the voltage across the measuring resistors (resistor $R_{ext}$ or resistor $R_{ref}$) are measured and provided to their respective nodes in the ADC circuit. By virtue of measuring only the differential voltage values, the DC voltage level at input node Vin is irrelevant to the operation of system 100. Thus, the digitizing ohmmeter system of the present invention can be advantageously applied to measure with great precision a small signal $\Delta V_{in}$ (the change in voltage Vin), even when $\Delta V_{in}$ is superimposed upon a much larger DC voltage. In the embodiment shown in FIG. 1, input sensor $R_{ext}$ is connected to the ground node but this is not required for proper operation of the digitizing ohmmeter system. The input sensor can be connected to a low impedance source at some DC potential, provided that the maximum voltage at Vref or Vin does not rise above the voltage compliance range of current source 105. This type of precision resistance measurement, accurate even in the presence of a slowly varying sensor DC offset bias voltage, cannot be readily achieved in conventional resistance measurement systems where single-ended DC coupled modulators are used.

Referring to FIG. 1, modulator 101 includes integrator 102 for receiving input voltage step Vin on node 148 and reference voltage step Vref on node 146 and integrating the charge associated with the step change in voltage Vin and voltage Vref. In the present embodiment, integrator 102 of modulator 101 includes an operational amplifier 112 and an accumulation capacitor $C_{accum}$. Input capacitor $C_{in}$ is coupled between node 148 (Vin voltage node) and node 110 which is the inverting input terminal of amplifier 112. The non-inverting input terminal of amplifier 112 is connected to the ground potential or any other convenient DC voltage that is an AC ground. Reference capacitor $C_{ref}$ is coupled between node 146 (Vref voltage node) and the inverting input terminal (node 110) of amplifier 112. A switch S5, controlled by a data dependent (Data_dep) signal, is connected between the inverting input terminal (node 110) and the output terminal (node 116) of amplifier 112. When switch S5 is closed, a short-circuited negative feedback loop is formed around amplifier 112 and integrator 102 is in an inactive mode.

When step input voltage Vin is coupled through input capacitor Cin, integrator 102 receives an input signal in the form of an input charge packet Qin. Input charge packet Qin is the charge that is transferred through capacitor $C_{in}$ due to the switched voltage change at voltage Vin. As described above, the amplitude of the transferred charge is given by: Qin=$C_{in}$*(Vin+−Vin−). The ratio of charge flow to unit time defines a current. The ADC average input current $I_{in}$ which flows through capacitor $C_{in}$ can be defined as:

$$I_{in} = \frac{Q_{in}}{T} = \frac{C_{in}\Delta V_{in}}{T}, \qquad \text{Eq. (4)}$$

where $\Delta$Vin=(Vin+−Vin−) and T is the period of the repetitive activation of switches S3 and S4 by complementary signals SEL_IN+ and SEL_IN−.

In modulator 101, the charge Qin is transferred through capacitor $C_{in}$ to node 110 which is a virtual ground node of amplifier 112. Note that in the present illustration, input charge packet Qin is shown as flowing from node 148 to node 110 (also referred to as a positive charge packet). The direction of flow for input charge packet Qin is a function of the polarity of input voltage step Vin that is sampled and used to generate input charge packet Qin. Specifically, when the positive-going transition of voltage step Vin is sampled, input charge packet Qin flows into node 110 of integrator 102 and a "positive" charge packet results. However, if the control signals of system 100 were modified so that a negative-going transition of voltage step Vin is sampled, input charge packet Qin would flow out of node 110 of integrator 102 and a "negative" charge packet results. In the present embodiment, charge balancing modulator 101 determines the value of the input voltage step Vin by balancing a positive input charge packet with a negative reference charge packet, as will be explained in more detail below. In other embodiments, a negative input charge packet can be used as long as the polarity of the reference charge packet and the polarity of either the analog signals (integ_out or integ_out_neg) or of the digital signals (digital_out and digital_out_bar) or the switch control signals (data_dep and data_dep_bar) are modified accordingly.

Amplifier 112 of integrator 102 also receives the reference voltage step Vref in the form of a reference charge packet Qref at the inverting input terminal (node 110) of amplifier 112. As discussed above, reference resistor $R_{ref}$ is excited by DC excitation current $I_{OUT}$ and the voltage across reference resistor $R_{ref}$ is sampled by the switching action of switches S1 and S2 under the control of signals SEL_REF+ and SEL_REF− to generate the reference voltage step Vref. Voltage step Vref is coupled through capacitor $C_{ref}$ to the inverting input terminal (node 110) of amplifier 112. The charge transferred through capacitor $C_{ref}$ can be expressed as $Q_{ref}=(C_{ref})(\Delta V_{ref})$ where $\Delta$Vref=(Vref−−Vref+). Voltage $\Delta$Vref, which is the voltage drop across reference resistor $R_{ref}$ as a result of excitation current $I_{OUT}$, can be expressed as ($R_{ref}*I_{OUT}$). The ratio of charge flow per unit time defines a current. The average current $I_{ref}$ supplied by the reference resistor can thus be defined as:

$$I_{ref} = \frac{Q_{ref}}{T} = \frac{C_{ref} R_{ref} I_{OUT}}{T}, \qquad \text{Eq. (5)}$$

where T is the period of the repetitive activation of switches S1 and S2 by complementary signals SEL_REF+ and SEL_REF−. The current $I_{ref}$ defines the maximum ADC input current which can be successfully balanced. An input current $I_{in}$ with the same magnitude as $I_{ref}$ is the fullscale input current of the ADC.

In the present embodiment, reference charge packet Qref is a negative charge packet because the negative-going transitions of reference voltage step Vref are used to generate the charge packet. Therefore, reference charge packet Qref is shown in FIG. 1 as flowing out of node 110 into node 146. Reference charge packet Qref can be a positive charge packet if the positive-going transitions of voltage step Vref are used to generate the charge packet. As explained above, the polarity of reference charge packet Qref is opposite the polarity of the input charge packet Qin to implement charge balancing in modulator 101. Furthermore, the magnitude of reference charge packet Qref is indicative of the full range of resistance measurement desired for digitizing ohmmeter system 100. That is, during normal operation, input charge packet Qin will always be as large as or smaller than reference charge packet Qref.

Integrator 102 of modulator 101 includes capacitor $C_{accum}$ switchably connected across amplifier 112 for storing the charge packets provided at input node 110. Specifically, one plate of capacitor $C_{accum}$ is connected to the inverting input terminal (node 110) of amplifier 112 while the other plate of capacitor $C_{accum}$ is connected to the output terminal (node 116) of amplifier 112 through a switch S6. Switch S6 is controlled by the inverse of the data dependent signal (Data_dep_bar). When switch S6 is closed, capacitor $C_{accum}$ is connected in the negative feedback loop of amplifier 112 and integrator 102 is in an active mode. When switch S6 is open, capacitor $C_{accum}$ is disconnected from amplifier 112 and integrator 102 is in an inactive mode whereby the voltage across and the charge stored on capacitor $C_{accum}$ are not affected by the operation of amplifier 112. As will become apparent in the description below, switch S5 and switch S6, controlled by Data_dep signal and its inverse respectively, operate in a complementary fashion (one switch closes while another opens) such that integrator 102 is either active (amplifier 112 connected to capacitor $C_{accum}$ by action of switch S6) or inactive (amplifier 112 shorted by action of switch S5). As a result, capacitor $C_{accum}$ integrates or discards the charge packets present at input node 110, depending on the state of the Data_dep signal.

The operation of modulator 101 will be described in brief here. Based on the control of clock signals Clk1 and Clk2, where the active portion of clock Clk1 is always passed through to the Data_dep signal and thence to switch S5, integrator 102 accumulates charge from the input charge packet Qin onto capacitor $C_{accum}$. Then, integrator 102 receives a periodic, non-data dependent reference charge packet when reference charge packet Qref is used, in a data dependant manner, to balance the charge accumulated due to the input voltage step Vin. Signals SEL_REF+ and SEL_REF− control the timing of the application of the reference charge packet Qref to the inverting input terminal (node 110) of amplifier 112. Specifically, in modulator 101, a reference charge packet is generated at each sampling cycle. However, integrator 102 is reconfigured by the operation of switches S5 and S6 in a data dependent manner so as to either allow the accumulation of the "bucking" reference charge packet at capacitor $C_{accum}$ or to keep the amplifier in an inactive (or autozero) mode and ignore the applied "bucking" reference charge packet.

In operation, when input voltage step Vin makes a positive-going transition from a given potential to another greater potential a positive charge packet Qin is generated. The closed loop amplifier circuit through amplifier 112 and capacitor $C_{accum}$ forces the input charge Qin to be accumulated at capacitor $C_{accum}$. If the charge at capacitor $C_{accum}$ increases above a certain threshold level, integrator 102 removes the charge on capacitor $C_{accum}$ by the amount of the reference charge packet. If the charge at capacitor $C_{accum}$ is below the threshold level, then integrator 102 does not remove any charge but still stores the charge on capacitor $C_{accum}$ provided by the positive input charge packet Qin. Thus, over several sampling cycles, capacitor $C_{accum}$ holds the running difference between the sum of the input charge packets Qin and the sum of the reference charge packets Qref that have been applied.

Returning to FIG. 1, the output voltage integ_out of integrator 102 (at node 114) is coupled to an inverting gain buffer 118. Buffer 118 is used to present a high impedance input to capacitor $C_{accum}$ such that no loading is placed on capacitor $C_{accum}$. In the present embodiment, buffer 118 has a gain of −K. Thus, the output voltage integ_out_neg from buffer 118 is equal to −K times the input voltage integ_out. In one embodiment, buffer 118 can have a gain of −1 whereby the buffer operates to merely invert the voltage polarity of the input voltage.

After buffer 118, the voltage integ_out_neg is coupled to a comparator 120 comparing the voltage integ_out_neg with a reference voltage $V_{TH}$. In the present embodiment, reference voltage $V_{TH}$ is a ground voltage. If the integ_out_neg value is equal to or greater than $V_{TH}$, comparator 120 generates a logical "1" as the output signal. If the integ_out_neg value is less then $V_{TH}$, comparator 120 generates a logical "0" as the output signal. Comparator 120 is controlled by clock signal Clk2 such that comparisons are triggered on the rising edge of clock signal Clk2 and the comparator outputs Q and Q are valid for at least the duration of clock signal Clk2. In one embodiment, voltage $V_{TH}$ is the logical threshold level of the inverter gate in the comparator. Buffer 118 is optional and may be omitted when the input terminal of comparator 120 can present a high impedance input to capacitor Caccum.

It is instructive to note that the output signal of integrator 102 is taken from the right plate of capacitor $C_{accum}$ and not from the output terminal of amplifier 112 as is done in conventional modulators. This construction provides several advantages. First, the integrator output signal integ_out is continuously connected to the subsequently circuitry without the use of intervening switches. Thus, the integ_out signal remains valid even if the integrator is in an inactive mode. For example, the integ_out signal can be used by the subsequent analog stages even during the time interval when the integrator amplifier is in a correlated double sampling mode (inactive mode). Using the valid signal during the correlated double sampling time can reduce the number of clock phases required for the modulator operation and make possible pipelined implementation of modulator 101. A second advantage concerns kT/C noise generated by the opening of switch S6. Because the output signal is taken from a point inside the feedback loop formed by amplifier 112, switch S6 and capacitor $C_{accum}$, the error charge generated by the opening of switch S6 is forced by the loop gain to partially be absorbed by the amplifier output circuits. Thus the output signal integ_out at node 114 exhibits diminished kT/C noise error compared to architectures where capacitor $C_{accum}$ is switched using conventional switched capacitor techniques.

The output signal digital_out from comparator 120 is a single bit digital data stream on terminal 121 which digital data stream is provided to digital post processing circuit 134 for filtering and determining the digital value thereof. In the present embodiment, the digital_out signal has an average ones density that is proportional to the average amplitude of the switched input voltage step Vin due to the DC excitation and switch sampling of the voltage across the external resistor $R_{ext}$ over the time period examined.

Modulator 101 includes a logic circuit 123 for implementing data dependent charge accumulation at integrator 102. That is, reference charge packets are continuously generated at node 146 but the modulation system determines whether to accumulate the reference charge packets at capacitor $C_{accum}$ in a data dependent manner. Specifically, the inverse of the digital_out signal (digital_out_bar), on terminal 122, is coupled to logic circuit 123 which generates the data dependent Data_dep signal (on node 130) and its inverse Data_dep_bar (on node 132). Data_dep signal is coupled to control switch S5 and Data_dep_bar signal is coupled to control switch S6 of integrator 102. In this manner, integrator 102 is activated or deactivated based on the data dependent signal and its inverse. As a result, the reference charge packet Qref is accumulated or ignored by the action of switches S5 and S6.

Logic circuit 123 is controlled by clock signal Clk2 and is activated on the rising edge of clock Clk2 for generating the Data_dep and Data_dep_bar signals. Logic circuit 123 also receives a clock signal Clk1 which controls integrator 102 for performing correlated double sampling, as will be described in more detail below. In the present embodiment, logic circuit 123 includes an AND logic gate 124 receiving the digital_out_bar signal and clock Clk2. The output of the AND gate is coupled to an OR logic gate 126 which also receives clock Clk1 as input. The output of OR gate 126 is the Data_dep signal. An inverter 128 is used to generate the inverse signal Data_dep_bar. Note that FIG. 1 merely illustrates one embodiment of logic circuit 123 and one of ordinary skill in the art would appreciate that logic circuit 123 can be implemented in other manners using other combination of logic gates to generate the same data dependent signals.

In operation, during the charge balancing phase, when the voltage integ_out at the output node 114 is zero or a negative voltage, signal integ_out_neg is at a zero or positive voltage and comparator 120 generates a logical hi value ("1") as digital_out. The inverse of digital_out on line 122 is thus a logical low value. Accordingly, Data_dep_bar signal on node 132 is asserted and switch S6 is closed to activate the integrator. The reference charge packet Qref is thus accumulated at capacitor $C_{accum}$ (which has the effect of increasing the voltage integ_out). Alternately, when the voltage integ_out at the output node 114 is a positive voltage, comparator 120 generates a logical low value ("0") as digital_out. The inverse of digital_out on line 122 is thus a logical hi value. Accordingly, Data_dep signal on node 130 is asserted and switch S5 is closed to short out (or deactivate) the integrator. As a result, the reference charge packet Qref is not accumulated and is dissipated by the amplifier output circuits. In this manner, modulator 101 accumulates the charge from the reference charge packet in a data dependent manner.

As mentioned above, modulator 101 employs correlated double sampling (CDS) to cancel the amplifier DC offset voltage, 1/f noise and wideband amplifier noise. Specifically, during the CDS phase of the sampling cycle activated by clock signal Clk1, integrator 102 is shorted out and capacitor $C_{accum}$ is disconnected from the amplifier. Any offset voltage, input 1/f noise and wideband voltage noise, collectively referred to as "the amplifier error voltage", at the input terminals of amplifier 112 also appear at the output terminal (node 116) of amplifier 112. Due to the short-circuited connection at amplifier 112, the voltages at the right plate of capacitor $C_{in}$ and at the right plate of capacitor $C_{ref}$ are thus charged to the amplifier error voltage. In this manner, the amplifier error voltage is stored on capacitors $C_{in}$ and $C_{ref}$ and is cancelled out at amplifier 112 during the subsequent input acquisition phase and during the subsequent data dependant Qref charge accumulations. Thus, a highly precise output voltage can be generated at amplifier 112, free of offset errors and amplifier noise.

As described above, the ADC circuit of digitizing ohmmeter system 100 is a charge balancing ADC where the modulator uses the reference charge packets to cancel the accumulated input charge. The number of times that the input charge must be balanced is often the digital parameter of interest as it corresponds to a quantized estimate of the average applied switched input signal step Vin. In the present embodiment, the input voltage step Vin is directly proportional to the resistance of the sensor $R_{ext}$ and the digital parameter of interest is the sensed resistance of resistive element $R_{ext}$. Thus, modulator 101 of digitizing ohmmeter system 100 is operated repeatedly over a large number of sampling cycles to generate a series of digital bit decisions that form a ones density data stream as the digital_out signal.

Figure 2:
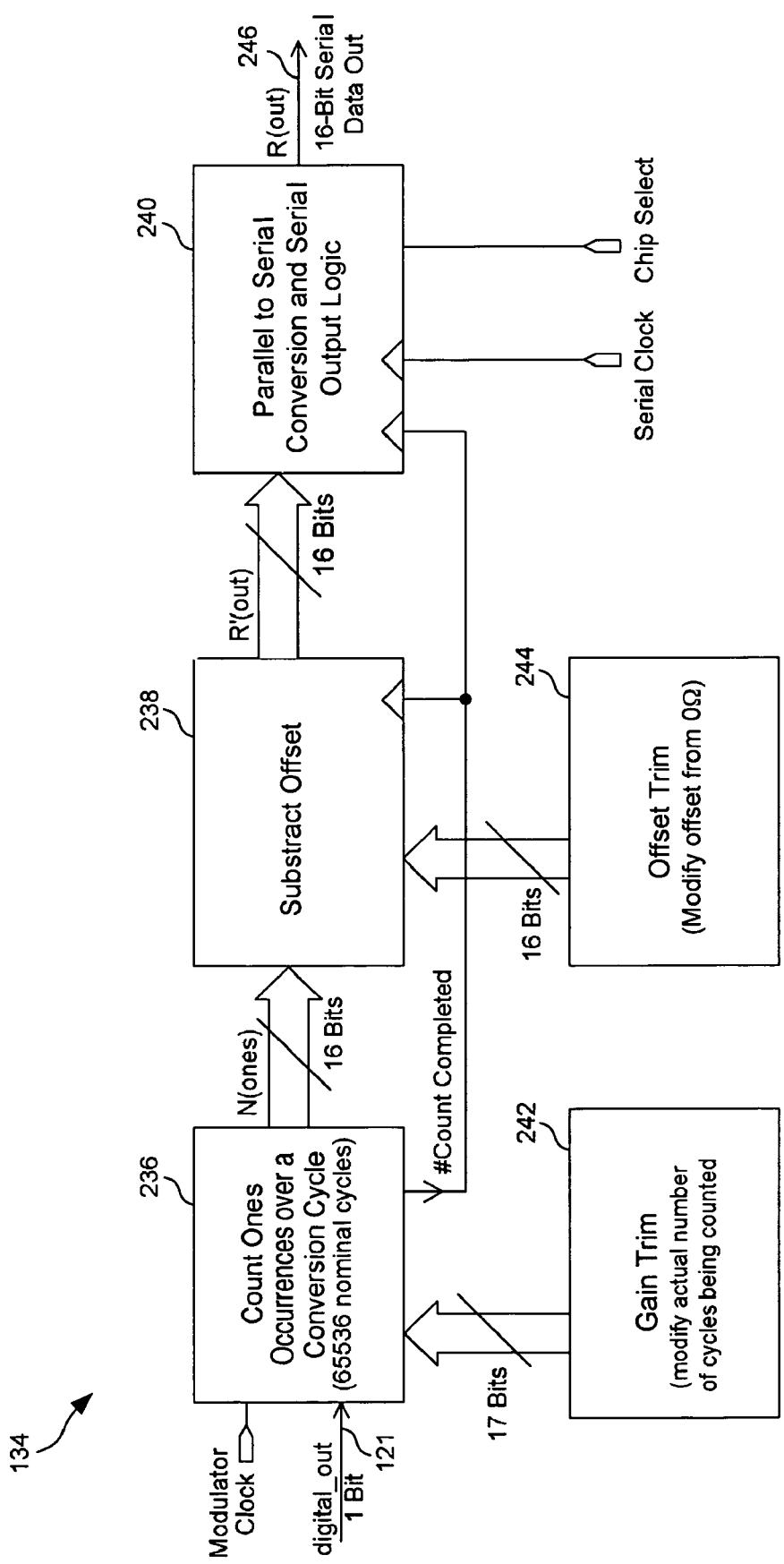
FIG. 2 is a block diagram of a digital post processing circuit which can be incorporated in the digitizing ohmmeter system of FIG. 1 according to one embodiment of the present invention.

Referring to FIG. 1, the digital_out signal from modulator 101 is coupled to digital post processing circuit 134 for digital processing. FIG. 2 is a block diagram of a digital post processing circuit which can be incorporated in digitizing ohmmeter system 100 according to one embodiment of the present invention. In the present embodiment, digital post processing circuit 134 is illustrated as providing a 16-bit digital output word as the resistance output signal R(out). Furthermore, in the present embodiment, digital post processing circuit 134 is illustrated as providing a serial data output. The 16-bit serial data output from circuit 134 is illustrative only. One of ordinary skill in the art would appreciate that digital post processing circuit 134 can be configured to generate a resistance output signal having the desired precision in either serial or parallel data format.

Referring to FIG. 2, circuit 134 includes a block 236 for counting the number of ones occurrences in digital_out signal over a conversion period, a block 238 for offset subtraction and a block 240 for converting the resistance output signal from parallel data format into serial data format. In the present embodiment, digital post processing circuit 134 further includes a block 242 for providing digital gain trim and a block 244 for providing offset trim.

Specifically, block 236 is coupled to receive the digital_out signal on bus 121 from modulator 101 and also to receive a modulator clock signal. To form a single 16 bit word of 16 bit precision from digital_out which is an one-bit data stream, it is necessary to count the number of "ones" present in $2^{16}$ or 65536 one-bit samples of the data stream.

The counting function of block 236 can be combined with the required gain adjust functionality provided by block 242 to make the actual number of samples accumulated programmable. For instance, for digitizing ohmmeter systems whose input gain is too low, not enough "ones" would be present in 65536 samples to accumulate to the desired number. Thus, such a resistance measurement unit would be digitally trimmed to count for slightly more than 65536 samples for each conversion. Similarly, for digitizing ohmmeter systems whose gain from the input is slightly high, the unit would count too many "ones" in 65536 samples. Such unit can be digitally trimmed to count slightly less than 65536 samples. Block 236 generates an accumulated count number N(ones) of 16 bits indicative of the sensed resistance of resistor $R_{ext}$.

A consequence of constructing a composite digital number from the addition of a large number of identically weighted samples is that the composite number so formed averages the effect of any wideband random noise over the set of samples added. The accumulation of 65536 samples corresponds to a finite impulse response digital lowpass filter described by 65536 unity-weighted coefficients. The lowpass filter characteristic of this stage of digital post processing filters out the effects of noise above roughly 1 part in 32768 of the ones density frequency, thereby greatly reducing the amount of noise within the final output numbers. In other embodiments, other decimating lowpass digital filters can be used to reduce noise level even more. However, the use of high performance decimating lowpass digital filters may increase the design complexity of the filters.

Imperfections in digitizing ohmmeter system 100 may result in small offset errors, potentially of random sign. These offset errors can be digitally corrected by applying a digital offset trim within a properly selected trim range. Block 244 of digital post processing circuit 134 provides a programmable digital offset which is subtracted from the accumulated count number N(ones) to correct for all offsets. Block 238 generates a resistance output value R'(out) in 16-bit parallel format.

Finally, when serial output data is desired, resistance output value is provided to block 240 to convert the 16-bit parallel data format to serial data format, under the control of a user-generated serial clock. The serial clock is used to serially clock the resistance output signal R(out) onto a data output line 246 which can be a data output pin of digitizing ohmmeter system 100. As mentioned above, block 240 is optional and is required only when serial output data is desired.

System Operation

Figure 3:
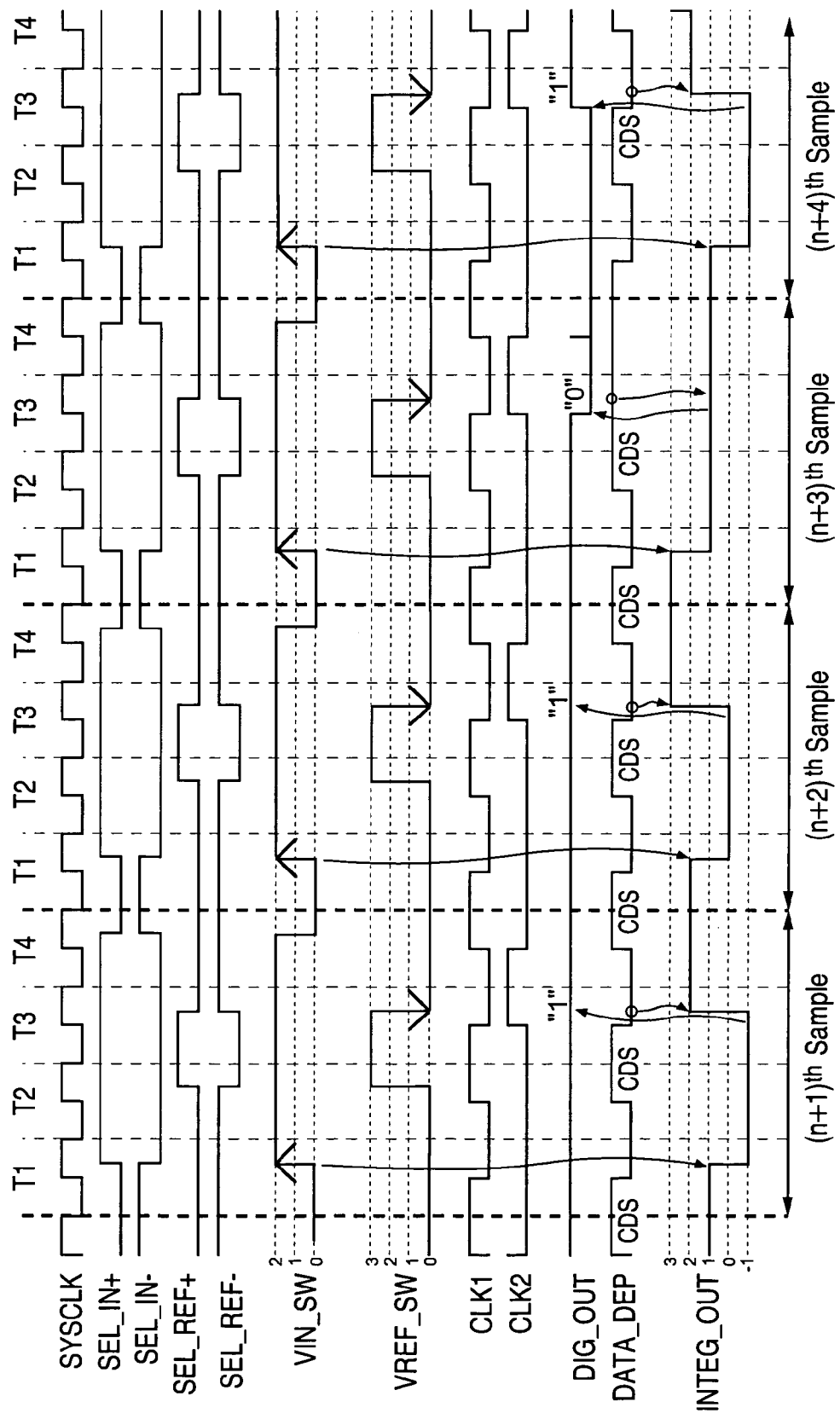
FIG. 3 illustrates one representative clocking scheme under which the digitizing ohmmeter system of the present invention can be operated.

The operation of digitizing ohmmeter system 100 will now be described with reference to the timing diagram of FIG. 3. FIG. 3 illustrates one representative clocking scheme under which the digitizing ohmmeter system of the present invention can be operated. Of course, one of ordinary skill in the art would appreciate that other clocking schemes can also be used to operate the digitizing ohmmeter system of the present invention to achieve low noise, high precision resistance measurements. In the clocking scheme shown in FIG. 3, each sampling cycle requires a four-state conversion process. The digitizing ohmmeter system of the present invention can thus be operated at a faster speed than other digitizing ohmmeter systems requiring more states per each sampling cycle.

Referring to FIG. 3, the signal waveforms and the corresponding values for the digital_out signal, the Data_dep signal and the integ_out signal are shown for four representative samples during a conversion of the repeated input voltage step Vin. The embodiment of digitizing ohmmeter system 100 of FIG. 1 implements a first order incremental ADC, and a single conversion to obtain q-bit digital output data requires $2^q$ samples of the input voltage step. For example, to convert an analog value into a 16-bit digital output data will require 65,536 samples in a single conversion. In the present embodiment, it is assumed that the amplitude of the multiple switched input voltage steps at Vin do not change or change very slowly during the time of a single conversion so that dynamic measurement errors can be ignored. In one embodiment of the present invention, a conversion time of 131.072 ms is required to obtain digital data of 16 bit precision and a conversion time of 8.192 ms is required to obtain digital data of 12 bit precision. Therefore, as long as the sensed input condition is not changing rapidly with respect to the conversion time period, the above assumption will hold.

FIG. 3 illustrates the timing and signal waveforms for the $(n+1)^{th}$ to $(n+4)^{th}$ samples of a conversion of the resistance of resistor $R_{ext}$ in digitizing ohmmeter system 100 of the present invention. The initialization of system 100 and the initial conditions of the various nodes of the system are not shown in FIG. 3. In one embodiment, when system 100 implements an incremental ADC, a switch is coupled across capacitor $C_{accum}$ to short out capacitor $C_{accum}$ before each conversion to remove any charge stored thereon. However, the shorting of capacitor $C_{accum}$ in an incremental ADC implementation between conversions is optional as any residual charge on the capacitor will only result in small measurement errors.

In the present illustration, the signals, including all the "SEL" signals, the CLK1 signal and the CLK2 signal, are generated based on the system clock ("SYSCLK") signal. Clock signals CLK1 and CLK2 are synchronized with the system clock signal. However, the SEL signals, including SEL_IN+, SEL_IN−, SEL_REF+ and SEL_REF−, are generated based on clock signal CLK1 but are slightly delayed with respect to the CLK1 clock signal. The delay between the clock edges of the CLK1 signal and the clock edges SEL signals are introduced to ensure that the transitions of the switched input voltage step and the switched reference voltage step occur when integrator 102 has been put in either the charge integration mode or in the correlated double sampling mode. In this manner, the charge associated with the desired transitions of the voltage steps (either positive-going or negative-going) is either integrated by integrator 102 or discarded. Delay circuitry that can be used to delay one signal with respect to another signal is well known in the art. In one embodiment, a chain of an even number of inverters can be used to introduce a predetermined amount of delay to a signal.

Each sampling cycle of system 100 can be viewed as including four phases: an input CDS phase, an input sampling and charge integration phase, a reference CDS phase and a data dependent charge balancing phase. Referring to FIG. 3, timing intervals T1, T2, T3 and T4 are provided to denote the four phases of the sampling cycle. Furthermore, signal integ_out as illustrated in FIG. 3 is a voltage signal used to indicate the amount of charge stored on capacitor $C_{accum}$. Capacitor $C_{accum}$ is located within the negative feedback path of inverting amplifier 112. Because the inverting amplifier will force the left plate of capacitor $C_{accum}$ at the inverting input terminal (node 110) to virtual ground, the integ_out voltage signal at the right plate of capacitor $C_{accum}$ (or the integrator output node 114) is given as:

$$V_{\text{integ\_out}} = -\frac{Q_{accum}}{C_{accum}}.$$

In FIG. 3, the vertical scale of the integ_out signal is divided into slices demarcating separate voltage units which voltage unit is a measurement unit used in the present description to quantify the charge stored or the charge transferred in system 100. The voltage units are defined solely to show the voltage change due to integration of one unit charge, where said unit charge will be used in the description of the operation of system 100. To facilitate the description of the operation of the digitizing ohmmeter system of the present invention, an artificial comparator $V_{TH}$ reference voltage for the integ_out signal can be assumed to correspond to the a voltage midway between voltage units labeled 0 an 1. Similarly, voltage steps Vin and Vdac are expressed in FIG. 3 in terms of voltage units.

At the end of the $n^{th}$ sampling cycle, capacitor $C_{accum}$ has stored thereon one negative unit of charge as a result of the charge integration and charge balancing phases during the $n^{th}$ sampling cycle. The voltage of integ_out signal at output node 114 of inverting amplifier 112 is therefore at one (1) voltage unit.

At the beginning of the $(n+1)^{th}$ sampling cycle (interval T1), SEL_IN− signal is asserted while SEL_IN+ signal is deasserted. Thus, switch S4 is closed while switch S4 is open and the voltage at the second terminal (node 108) of the external resistor $R_{ext}$, the Vin− voltage, is sampled onto the left plate of capacitor Cin. The input voltage Vin is thus stable at a low voltage level. Similarly, switch S2 is closed while switch S1 is open and the voltage at the second terminal (node 144) of reference resistor $R_{ref}$, the Vref− voltage, is being sampled onto the left plate of capacitor Cref.

During the initial part of interval T1, clock CLK1 is at a logical high and the DATA_DEP signal is thus asserted to close switch S5 and open switch S6. Integrator 102 is thus in the input correlated double sampling (CDS) phase (integrator in an inactive mode). As a result of closing switch S5, amplifier 112 is shorted out and integrator 102 is inactive. Therefore, any amplifier error voltage, such as those due to DC offset voltage and 1/f noise, appears on the amplifier output terminal. Input capacitor $C_{in}$ and reference capacitor $C_{ref}$ are thereby precharged with the amplifier error voltage so that the amplifier error voltage is cancelled out during the sampling and charge integration of the input voltage step and the reference voltage step, respectively. In this manner, correlated double sampling of the system is effectuated.

After correlated double sampling is performed, clock CLK1 is deasserted and the DATA_DEP signal is released. Switch S5 is open and switch S6 is closed to put integrator 102 of modulator 101 in an active mode and the sampling and charge integration phase begins. After a predetermined delay, the SEL signals controlling switches S3 and S4 switch states to generate the input voltage step Vin. Specifically, after the predetermined delay, SEL_IN− signal is deasserted while SEL_IN+ signal is asserted. Switch S4 is open and switch S3 is closed and the voltage at the first terminal (node 144) of resistor $R_{ext}$, the Vin+ voltage, is sampled and a switched input voltage step Vin having a positive-going transition is generated.

In response to the switching action of switches S3 and S4, input voltage Vin steps from a first voltage value to a second, higher voltage value. The change in voltage Vin (ΔVin) is coupled through capacitor $C_{in}$ to the inverting input terminal of amplifier 112. Because it is assumed that the input voltage step persists for a long time as compared to the input circuit time constants, all the charge collected at the left plate of capacitor $C_{in}$ associated with ΔVin is transferred to the right plate of capacitor $C_{in}$. Specifically, the charge coupled through capacitor $C_{in}$ is given by:

$$Q_{in} = C_{in}\Delta V_{in}$$

where ΔVin is the change in input voltage Vin due to the synchronous switching action of switches S3 and S4 and $C_{in}$ is the value of capacitor $C_{in}$.

Because integrator 102 is in the active mode, amplifier 112 forces the inverting input terminal (node 110) to a virtual ground. Therefore, the charge coupled through capacitor $C_{in}$ is directed to capacitor $C_{accum}$. Because amplifier 112 is configured in an inverting mode, the increase in charge stored in capacitor $C_{accum}$ causes a decrease in the voltage at the integ_out node (node 114) proportional to the magnitude of the charge Qin to be accumulated:

$$\Delta V_{\text{integ\_out}} = -\frac{\Delta Q_{accum}}{C_{accum}} = -\frac{Q_{in}}{C_{accum}} = -\Delta V_{in}\frac{C_{in}}{C_{accum}}$$

where Qaccum is the charge accumulated at capacitor $C_{accum}$, and $C_{accum}$ represents the capacitance of capacitor $C_{accum}$.

In the present embodiment, capacitor $C_{in}$ and capacitor $C_{accum}$ have the same capacitance value. In one embodiment, the capacitance of capacitor $C_{in}$ and of capacitor $C_{accum}$ is each 2 pF. In the present illustration, it is assumed that the rising edge of Vin causes two additional charge units to be stored in capacitor $C_{accum}$ and thus the integ_out signal decreases by two voltage units to a level of minus one (−1) voltage unit.

Because integrator 102 is active before, during and after the Vin rising edge, continuous time integration of the input voltage step signal is realized. The use of continuous time integration to sample the input analog voltage has the effect of low pass filtering the input signal and thereby filters out any wideband noise that may present on the input signal Vin+.

After sampling and integrating the charge associated with the rising edge of input voltage Vin, the charge integration phase of the sampling cycle has completed and system 100 performs correlated double sampling (CDS) for the reference voltage signal Vref (time interval T2). In the reference CDS phase, capacitor $C_{in}$ and capacitor $C_{ref}$ are again precharged with the amplifier error voltage from amplifier 112. Referring to FIG. 3, during time interval T2, clock Clk1 is asserted. As a result, OR gate 126 of logic circuit 123 generates a logical "hi" value on output node 130. Thus, Data_dep signal switches to a logical "hi" value and Data_dep_bar switches to a logical "low" value correspondingly. Accordingly, switch S5 is closed and switch S6 is open and integrator 102 is made inactive to initiate correlated double sampling.

After a predetermined delay from the rising edge of clock CLK1, the SEL signals controlling switches S1 and S2 switch states to generate a positive-going reference voltage step Vref. Specifically, after the predetermined delay from the rising edge of clock CLK1, SEL_REF− signal is deasserted while SEL_REF+ signal is asserted. Switch S2 is open and switch S1 is closed and the voltage at the first terminal (node 142) of resistor $R_{ref}$, the Vref+ voltage, is sampled and a reference voltage step Vref having a positive-going transition is generated. In the present embodiment, the positive-going transition of the reference voltage step Vref is not used by system 100. Thus, the positive-going switched transition of voltage Vref occurs during the reference CDS phase of the sampling cycle so that the rising edge of the reference voltage Vref is ignored by system 100 and no charge from the Vref rising edge is accumulated by integrator 102. By causing the voltage steps to transition during the CDS phase, undesired signal transitions can be blocked from being sampled by the integrator.

In time interval T3, clock CLK1 is deasserted and clock CLK2 is asserted. Two events occur as a result. First, when clock CLK2 is asserted, comparator 120 is interrogated and the digital_out value for the current sample is read out. Because integ_out has a value of minus one (−1) voltage unit, inverting gain buffer 118 converts integ_out signal to integ_out_neg signal having a relatively positive voltage level (such as +K voltage units, when K=1, integ_out_neg signal is about +1 voltage unit). At comparator 120, the integ_out_neg signal is compared with reference voltage $V_{TH}$ which is assumed to be between 0 and 1 volt in the present embodiment. Because the integ_out_neg signal is greater than $V_{TH}$, comparator 120 generates a logical high value as the digital_out "Q" output. Thus, the digital_out signal remains at a logical "1" value during interval T3 in response to clock Clk2.

When clock CLK1 is deasserted, the DATA_DEP signal is released by OR gate 126 in logic circuit 123 and the data dependent charge balancing phase begins. During the charge balancing phase, system 100 determines in a data dependent manner whether to accumulate or disregard the negative reference charge packet to be generated by the falling edge of voltage step Vref. Specifically, when clock CLK2 is asserted and clock CLK1 is deasserted, integrator 102 is no longer forced in the inactive mode but instead the integrator is either active or inactive depending upon the value of the digital_out signal and consequently the Data_dep signal. That is, the DATA_DEP signal becomes a function of the digital_out signal.

In logic circuit 123, AND gate 124 receives as input signals clock Clk2 and the digital_out_bar signal (Q) which is the inverse of the digital_out signal. When clock Clk2 is asserted, the output of AND gate 124 will have the same value as the digital_out_bar signal. The output of OR gate 126 is also the same as the output of AND gate 124 as the other input of OR gate 126 (clock Clk1) is deasserted. Thus, logic circuit 123 generates a Data_dep signal which is the inverse of the digital_out signal. If digital_out has a logical "hi" value (digital_out_bar has a logical "lo" value), DATA-_DEP will have a logical "lo" value and vice versa. In the current sampling cycle, digital_out has a logical "hi" value when clock CLK2 is asserted, thus the DATA_DEP signal switches to a logical "lo" value when clock CLK2 is asserted. As a result of DATA_DEP signal being at a logical "lo" value, switch S5 is open and switch S6 is closed to put integrator 102 of modulator 101 in an active mode.

To implement charge balancing in system 100, a negative reference charge packet is applied to integrator 102 at each sampling cycle to balance out the positive charge accumulated from the ΔVin voltage. In FIG. 3, voltage waveform Vref represents the voltage used to generate the reference charge packet Qref. In the present embodiment, to effectuate charge balancing, only the negative charge packet associated with the falling edge (negative-going transition) of voltage Vref is used. As described above, the positive-going transition of voltage Vref is applied during the reference CDS phase while integrator 102 is deactivated so that the positive charge packet associated with the rising edge of voltage Vref has been ignored.

After a predetermined delay from the falling edge of clock CLK1, the SEL signals controlling switches S1 and S2 switch states to generate a negative-going reference voltage step Vref. Specifically, after the predetermined delay from the falling edge of clock CLK1, SEL_REF− signal is asserted while SEL_REF+ signal is deasserted. Switch S1 is open and switch S2 is closed and the voltage at the second terminal (node 144) of resistor $R_{ref}$, the Vref− voltage, is again sampled and a reference voltage step Vref having a negative-going transition is generated.

As described above, during interval T3, because the DATA_DEP signal is at a logical "lo" value, switch S5 is open and switch S6 is closed so that integrator 102 is activated. The negative charge associated with the falling edge of voltage Vref is thus accumulated by integrator 102. As shown in FIG. 3, the integ_out value increases by three voltage units, from −1 to 2, as a result of accumulating the negative reference charge packet (the reference charge packet is assumed to exhibit an amplitude of minus three (−3) charge units. Note that because integrator 102 is activated before, during and after the falling edge of the reference charge packet, the integrator implements continuous time integration which effectuates a low-pass filter function for filtering any wideband noise on the Vref+ reference voltage signal.

At the end of the charge balancing phase, capacitor $C_{accum}$ has accumulated charged based on the change in input voltage ΔVin and based on the reference charge packet, in a data dependent manner. During the $(n+1)^{th}$ sampling cycle the accumulated charge has increased by two units and decreased by three, resulting in a held charge of two charge units at capacitor $C_{accum}$ and a voltage at integ_out of two voltage units. The system is then reset in preparation for the next sampling cycle.

During time interval T4, clock CLK1 is asserted and clock CLK2 is deasserted. When clock CLK1 is asserted, the DATA_DEP signal is forced to a logical "hi" value for placing integrator 102 in the inactive mode (CDS phase). Then after a predetermined delay from the rising edge of clock CLK1, the SEL signals controlling switches S3 and S4 switch state. Thus, switch SS3 is open while switch S4 is closed. Input voltage step Vin thus makes a negative going transition back to the VIN− voltage currently being sampled. In the present timing scheme, the high-to-low transition of input voltage Vin is not to be accumulated by integrator 102. Therefore, in the present timing scheme, the SEL signals controlling switches S3 and S4 (SEL_IN+ and SEL_IN−) switch states during the CDS phase of integrator 102 (time interval T4). Thus, the falling edge of input voltage step Vin is ignored by system 100 and no charge from the Vin falling edge is accumulated. System 100 is now ready for the next sampling cycle.

During the $(n+2)^{th}$ sampling cycle, system 100 operates in the same manner as described above. When the charge associated with the positive step ΔVin voltage, having two charge units, is accumulated, the charge at capacitor $C_{accum}$ increases by 2 charge units and the voltage at the integ_out node (node 114) decreases to 0 voltage unit. Because comparator 120 continues to read an integ_out_neg value that is less than $V_{TH}$, digital_out signal remains at a logical "1"

value. The digital_out signal generated by comparator 120 determines whether the subsequently generated reference charge packet will be accumulated in capacitor $C_{accum}$ or discarded. When digital_out signal has a logical "1" value, during the data dependent charge balancing phase, the negative reference charge packet is accumulated by capacitor $C_{accum}$ and Qaccum decreases by three charge units, with a corresponding increase in the voltage at integ_out of 3 voltage units. A sum of negative three charge units is stored on capacitor $C_{accum}$ at the end of the $(n+2)^{th}$ sampling cycle, and the voltage at integ_out is at positive three (+3) voltage units.

At the $(n+3)^{th}$ sampling cycle, integ_out signal has a voltage level that exceeds the artificial $V_{TH}$ reference level at time interval T3. Specifically, the voltage at integ_out is at positive one (+1) voltage units after integration of the ΔVin voltage. Thus, the integ_out_neg signal becomes a negative voltage value or a voltage value less than $V_{TH}$. Thus, comparator 120 generates a logical "0" as the Q output value and digital_out transitions to a logical "0" value as shown in FIG. 3.

As a result of digital_out being at a logical "0" value, the Data_dep signal remains at a logical "1" value when the charge balancing phase (interval T3) is initiated. The state of the Data_dep signal causes switch S5 to close and switch S6 to open. Thus, integrator 102 is deactivated and capacitor $C_{accum}$ is prevented from accumulating any charge from the falling edge of the reference charge packet. Integ_out thus remains at the positive one voltage unit level at the end of the $(n+3)^{th}$ sampling cycle.

As shown by the operation of sampling cycles (n+1) to (n+3), digitizing ohmmeter system 100 implements data dependent charge balancing and the charge associated with the falling edge of switched voltage Vref, which is used to generate the reference charge packet Qref, is either accumulated or ignored depending on the value of the digital_out signal. The sampling cycles are repeated until a large enough number of the digital bit decisions have been made so that the residual quantization error of the digitizing process is below certain desired application specific limits.

During the $(n+4)^{th}$ sampling, the charge associated with the positive step ΔVin voltage, having two charge units, is accumulated, the charge at capacitor $C_{accum}$ increases by 2 charge units and the voltage at the integ_out node (node 114) decreases to −1 voltage unit. Because comparator 120 reads an integ_out_neg value that greater than $V_{TH}$, digital_out signal switches to a logical "1" value. Thus, during the data dependent charge balancing phase, the negative reference charge packet is accumulated by capacitor $C_{accum}$ and Qaccum decreases by three charge units, with a corresponding increase in the voltage at integ_out of 3 voltage units. A sum of two charge units is stored on capacitor $C_{accum}$ at the end of the $(n+4)^{th}$ sampling cycle, and the voltage at integ_out is at positive two (+2) voltage units.

In sum, in the present embodiment, digitizing ohmmeter system 100 implements charge balancing by sampling only the rising edge of the switched input voltage step Vin and accumulating, in a data dependent manner, only reference charge packets generated by the falling edge of switched voltage Vref. Because integrator 102 is an inverting integrator, the integ_out signal decreases due to the rising edge of Vin and increases due to the negative reference charge packet.

As a result of adding and subtracting the charge due to the ΔVin voltage and the charge from the reference charge packet, the digitizing ohmmeter system generates a digital_out signal in the form of a ones density data stream. The single bit output data stream generated by comparator 120 will exhibit a ones density proportional to the amplitude of the change in input voltage ΔVin. Specifically, under the assumption that the step size ΔVin does not change appreciably over a single conversion, the average ones density is given as:

$$OnesDensity = \Delta Vin \frac{C_{in}}{C_{ref}V_{ref}} = \frac{Q_{in}}{Q_{ref}} = \frac{R_{ext}}{R_{ref}},$$

where Qref denotes the amount of charge in the reference charge packet. The ones density value is always less than or equal to 1 as Qin is always less than or equal to Qref. For example, in the present illustration, the ΔVin voltage step generates an input charge Qin that has a charge unit level that is ⅔ of the reference charge packet Qref. Thus, a ones density data stream containing 66.7% ones and 33.3% zeroes is generated. After completing a conversion of the input voltage value, the ones density pulse stream can be processed by the subsequent digital processing circuitry to determine the digital value thereof.

Specifically, referring to FIG. 2, the ones density data stream is coupled to block 236 for counting the number of occurrences of ones over the conversion period. Then the count value, which indicates a resistance measurement, is converted to a resistance output value by subtracting an offset trim, if any, in block 238. The resistance ratio output value R(out) can then be provided as a digital output in a serial format by block 240. As described above, gain and offset trims can be applied to correct for offset errors and to improve the accuracy of the resistance output value.

Alternate Embodiments

In the present embodiment, the digitizing ohmmeter system accumulates charge on the rising edge of switched input voltage step Vin and on the falling edge of the switched reference voltage step Vref. However, this implementation scheme is illustrative only and one of ordinary skill in the art would appreciate that the digitizing ohmmeter system of the present invention can be operated using other clocking schemes. For instance, the digitizing ohmmeter system can be made to accumulate charge on the falling edge of input voltage step Vin and on the rising edge of the reference voltage step Vref. In that case, because the modulator uses an inverting amplifier, the integ_out signal does not need to be inverted before being compared with the reference voltage $V_{TH}$. Thus, inverting gain buffer 118 between capacitor $C_{accum}$ and comparator 120 can be eliminated or a non-inverting buffer amplifier may be utilized. Basically, the digitizing ohmmeter system of the present invention can be operated by integrating the rising or falling edge of the input voltage step Vin and balancing the input charge packet with a reference charge packet having the opposite polarity to the polarity of the input charge packet.

In the above descriptions, amplifier 112 is implemented as an operational amplifier where the non-inverting input terminal is connected to the ground potential. In an alternate embodiment, the amplifier can be implemented as a single input self-referential inverting transconductance amplifier (referred to herein as a gmIC). An amplifier capable of operating at very low voltage levels with uncompromised or even improved performances in transconductance is described in commonly assigned U.S. Pat. No. 6,147,550, entitled "Method And Apparatus For Reliably Determining Subthreshold Current Densities In Transconductance Cells," of Peter R. Holloway, issued Nov. 14, 2000; and also in commonly assigned U.S. Pat. No. 5,936,433, entitled "Comparator Including A Transconducting Inverter Biased To Operate In Subthreshold," of Peter R. Holloway, issued Aug. 10, 1999. Both of the aforementioned patents are incorporated herein by reference in their entireties. Thus, in the alternate embodiment, amplifier 112 is implemented based on the transconductance inverting cell technology described in the aforementioned patents and amplifier 112 is self-referencing. Therefore, amplifier 112 includes only one input terminal coupled to node 110 and no reference voltage input terminal is needed.

Furthermore, in another alternate embodiment, comparator 120 can also be implemented as a transconductance amplifier (gmIC) described above. Because a gmIC is a single input self-referential amplifier, comparator 120 will not require a separate reference voltage $V_{TH}$. When amplifier 112 or comparator 120 is implemented as a gmIC, the digitizing ohmmeter system of the present invention can be operated with a very low noise level even at minimal supply voltage because gmIC amplifiers are designed to run at a constant current density over temperature.

Switches S5 and S6 in modulator 101 are composed of MOS transistors and are typically controlled by non-overlapping digital signals. When any MOS switch is turned from on to off, its stored channel charge will be shared by the capacitors and circuit elements connected to both its analog input and its analog output terminals. This charge sharing condition is often referred to as charge feed-through. This channel charge is an additive error because it does not originate from the input analog signals but is generated from within the switches when they are switched off.

In one embodiment, the switches in modulator 101 can be implemented using any conventional switch circuits. According to an alternate embodiment of the present invention, switches S5 and S6 of modulator 101 are implemented as "boosted" switches to reduce charge feed-through that may occur when the switches are being turned on or off. A self-bootstrapping constant on-resistance switch circuit is described in copending and commonly assigned U.S. patent application Ser. No. 10/402,080, entitled "A Constant $R_{ON}$ Switch Circuit with Low Distortion and Reduction of Pedestal Errors," of Peter R. Holloway, filed Mar. 27, 2003, which patent application is incorporated herein by reference in its entirety. When the low distortion boosted switch circuit described in the aforementioned patent application is used to implement switches S5 and S6, errors resulting from channel charge feed-through during the switching of the switches are significantly reduced and excellent measurement accuracy can be realized in the digitizing ohmmeter system of the present invention, which accuracy cannot be readily realized in conventional resistance measurement systems.

Furthermore, in another embodiment of the present invention, switch S5 and switch S6 are scaled to ensure that the net charge error accumulated in capacitor $C_{accum}$ during each sampling cycle is nearly zero. Specifically, because switch S5 and switch S6 are connected to different nodes within the modulator circuit, the feed-through charge error generated by equally-sized switches does not result in a zero net charge error across capacitor $C_{accum}$. It is known that the channel charge error generated within a switch is proportional to its gate area. By scaling the ratio of the gate areas of switches S5 and S6 appropriately, the amount of charge error can be applied to both sides of capacitor $C_{accum}$, first by one switch and then by the other, which results in a net charge error of nearly zero being held in capacitor $C_{accum}$ at the end of each sampling cycle.

In one embodiment, the digitizing ohmmeter system of the present invention, including the variable resistive element $R_{ext}$ and the digital post processing circuit, is integrated onto a single integrated circuit. In other embodiments, the variable resistive element $R_{ext}$ can be an input sensor external to the integrated circuit on which the digitizing ohmmeter system is formed. In that case, the excitation current $I_{OUT}$ is provided to resistor $R_{ext}$ through external pins on the digitizing ohmmeter system. Similarly, the reference resistive circuit element RREF can be a resistance external to the integrated circuit on which the digitizing ohmmeter system is formed, and driven by current $I_{OUT}$ through external pins. In another embodiment the resistive circuit element RREF is integrated onto the same single integrated circuit. In yet another embodiment, the digital post processing circuit of the digitizing ohmmeter system may be formed on an integrated circuit separate from the digitizing ohmmeter system. In general, the digitizing ohmmeter system of the present invention can be fabricated using various degree of integration, as is well understood by one skilled in the art.

Resistance Measurement Applications

The digitizing ohmmeter system of the present invention can be configured for performing various kinds of resistance measurement. Specifically, the digitizing ohmmeter system of the present invention can be applied to measure the resistance of an input sensor whose resistance changes in response to a stimulus of interest. Several applications of the digitizing ohmmeter system of the present invention for resistance or temperature measurements are described below. The following description is illustrative only and is not intended to be limiting. One of ordinary skill in the art, upon being apprised of the present description, would appreciate that the digitizing ohmmeter system of the present invention can be applied in other configurations for measuring the resistance of an input sensor.

Absolute Ohms Measurement Application

Figure 4:
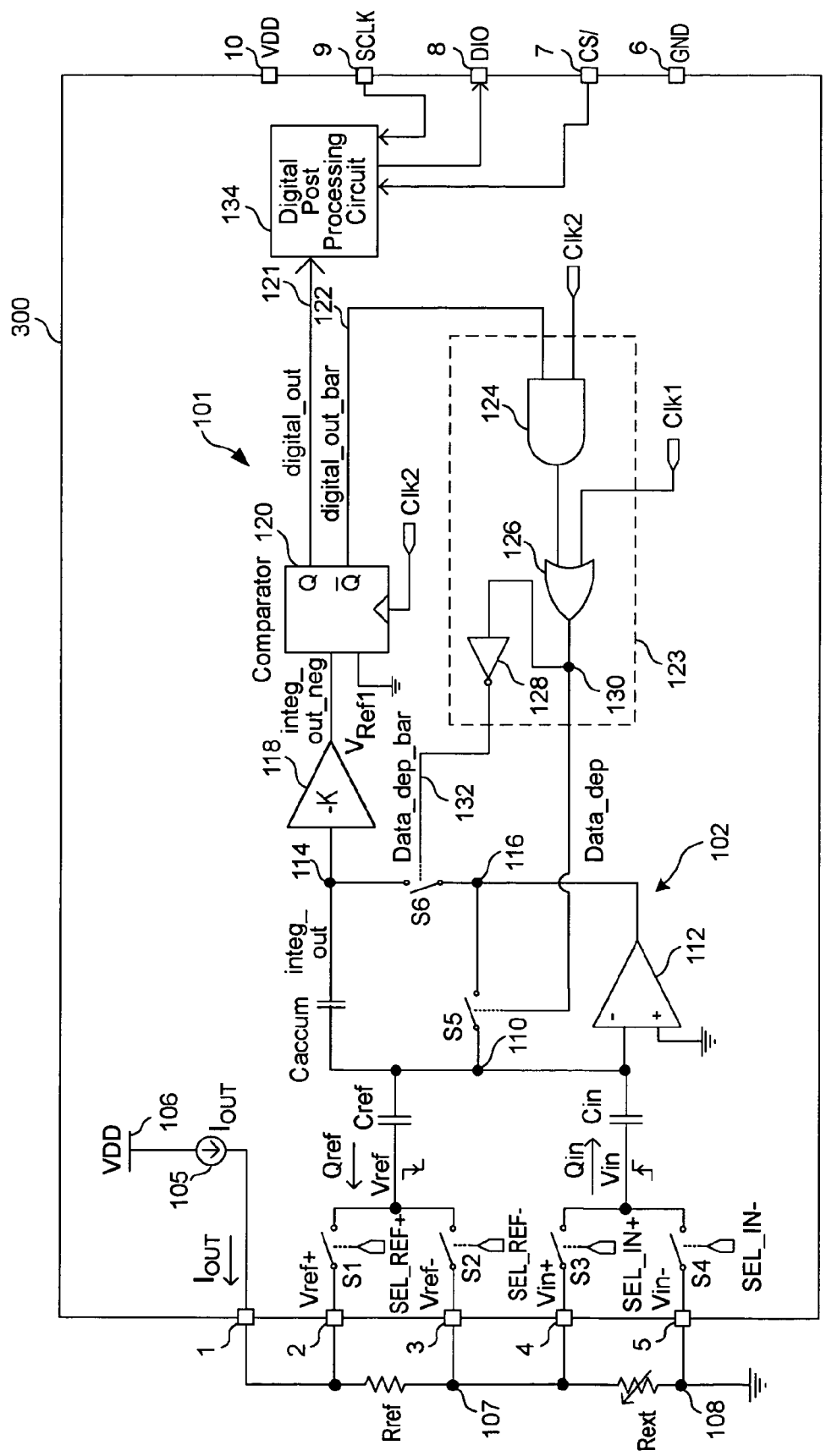
FIG. 4 is a schematic diagram of a ratiometric digitizing ohmmeter system configured to measure the ratio of an external resistance Rext to a known reference resistance Rref according to one embodiment of the present invention.

FIG. 4 is a schematic diagram of a ratiometric digitizing ohmmeter system configured for absolute ohms measurement according to one embodiment of the present invention. Like elements in FIGS. 1 and 4 have like reference numerals to simplify the discussion. In the absolute ohms application, the resistance of the input sensor ($R_{ext}$) is compared to the known resistance of the reference resistor ($R_{ref}$) for determining the absolute resistance of the input sensor. The value of the reference resistor is assumed to be known. Discrete resistors are measured by the resistor manufacturer who measures the resistors and sells them with a guarantee that they are of a standard value within a known tolerance. Thus the resistance value of the reference resistor may be known to within an error bound by selecting resistors guaranteed to be within that error bound. Alternately the actual value of the resistor $R_{ref}$ can be measured with a reference Ohmmeter once before being incorporated in the digitizing ohmmeter system of the present invention. Implementations where the resistor $R_{ref}$ is on the integrated circuit may have the value of resistor $R_{ref}$ trimmed to a known error bound or may have the resistance $R_{ref}$ measured once to high accuracy and stored as a nonvolatile parameter, such as in EEPROM used for the gain adjust trim. The digital output value of the digitizing ohmmeter system is the ratio of the input sensor resistance to the reference resistance ($=R_{ext}/R_{ref}$). When this digital ratio is multiplied by the known value $R_{ref}$, the value of $R_{ext}$ can be determined as: $R_{ext}=(R_{ext}/R_{ref})*R_{ref}$.

In practice, the multiplication is usually not explicitly performed because the digital number representing the ratio is interpreted to be an external resistance with a magnitude of that fraction of $R_{ref}$. For example, if $R_{ref}$ is known to be 4096 Ohms, then each LSB (least significant bit) of a 12 bit binary digital output can be interpreted as being indicative of 1 Ohm in value at resistor $R_{ext}$. Similarly, if the resistance is known to be a different value, such as 2 kOhms, then the LSB of a 12 bit output word can be interpreted to represent (2000/4096) Ohms (approximately 0.48828 Ohms per LSB). If the reference resistor was previously measured to high accuracy and its value remained stable during the time interval of measurement, then the digital output value indicative of the resistance of the input sensor can also be very accurate. Similarly, if the reference resistor is measured once and then the optional gain adjust EEPROM in the digital post processing circuit 134 is adjusted in accordance with this value, then no explicit multiplication will be necessary.

Referring to FIG. 4, a ratiometric digitizing ohmmeter system (300) is shown. The system 300 is the same as system 100 of FIG. 1 with the addition of more detail to show one embodiment of digital output interfacing. The digital output of modulation system 101 is digital_out, which is coupled to the post processing circuit (134) in which the digital post processing and serial output data formatting and control is performed. A second system, such as a microprocessor with a three wire serial interface, is an example of a system which could request and read the resistance data over the three wire serial interface at nodes 7, 8 and 9. Because system 300 responds to external requests for data, it is considered to be a slave device on the serial interface, while the second (microprocessor) system is considered to be the serial bus master system.

In the present embodiment, system 300 is formed on a single integrated circuit and includes input/output terminals (pins) for coupling to the resistance measurement components and for coupling to the second system which reads the R(out) data from the ratiometric digitizing ohmmeter system 300. Specifically, for coupling to the resistance measurement components, system 300 of the ratiometric digitizing ohmmeter system includes pin 1 providing the DC excitation current $I_{OUT}$, pin 2 and pin 3 for coupling to a reference resistor $R_{ref}$, and pin 4 and pin 5 for coupling to the input sensor whose resistance is to be measured. System 300 also includes a pin 6 for connecting to the Vss or ground voltage and a pin 10 for connecting to the Vdd or positive power supply voltage. System 300 may include a chip-select pin 7 receiving an enable signal for the system. The chip-select function is optional as other serial communications protocols can be implemented without chip-select pin, such as SMbus or I2C. System 300 includes a pin 8 providing the bit-serial digitized resistance ratio R(out) signal and a pin 9 for accepting a system clock (SCLK) signal from the second system for synchronizing the operation of the serial output data to the operation of the external data-reading system.

To measure the absolute resistance of an input sensor, the input sensor, denoted as a variable resistance resistor $R_{ext}$, is coupled between pin 4 and pin 5 of system 300. One terminal of the resistor should also be coupled to the ground voltage or to some other low impedance DC voltage source that is an AC ground. A reference resistor whose resistance establishes the fullscale range of the ADC of the digitizing ohmmeter system is coupled between pin 2 and pin 3 of sub-system 300. Pin 1 is connected to resistor $R_{ref}$ to force the current $I_{OUT}$ through resistor $R_{ref}$ while pin 2 is connected to sense the voltage at that terminal of $R_{ref}$. Pin 3 is connected to the other terminal of resistor $R_{ref}$ to sense the voltage at Vref–. The terminal of resistor $R_{ref}$ which is connected to pin 3 is connected to the resistance to be measured (resistor $R_{ext}$) in order to force the same current through resistor $R_{ext}$. Pin 4 is connected to the terminal of $R_{ext}$ which receives the current from resistor $R_{ref}$ in order to sense the voltage at that point. The other terminal of resistor $R_{ext}$ is connected to the ground terminal in order to return the current $I_{OUT}$. Pin 5 is connected to the grounded terminal of $R_{ext}$ in order to sense the voltage at that node. When thus configured, the ratiometric digitizing ohmmeter system 300 measures the resistance of the input sensor as a ratio of the resistance of the input sensor $R_{ext}$ to the reference resistor $R_{ref}$. Since the resistance of the reference resistor is known, highly accurate measurement of the resistance of the input sensor $R_{ext}$ can be implemented.

Ratiometric Potentiometer Application

Figure 5:
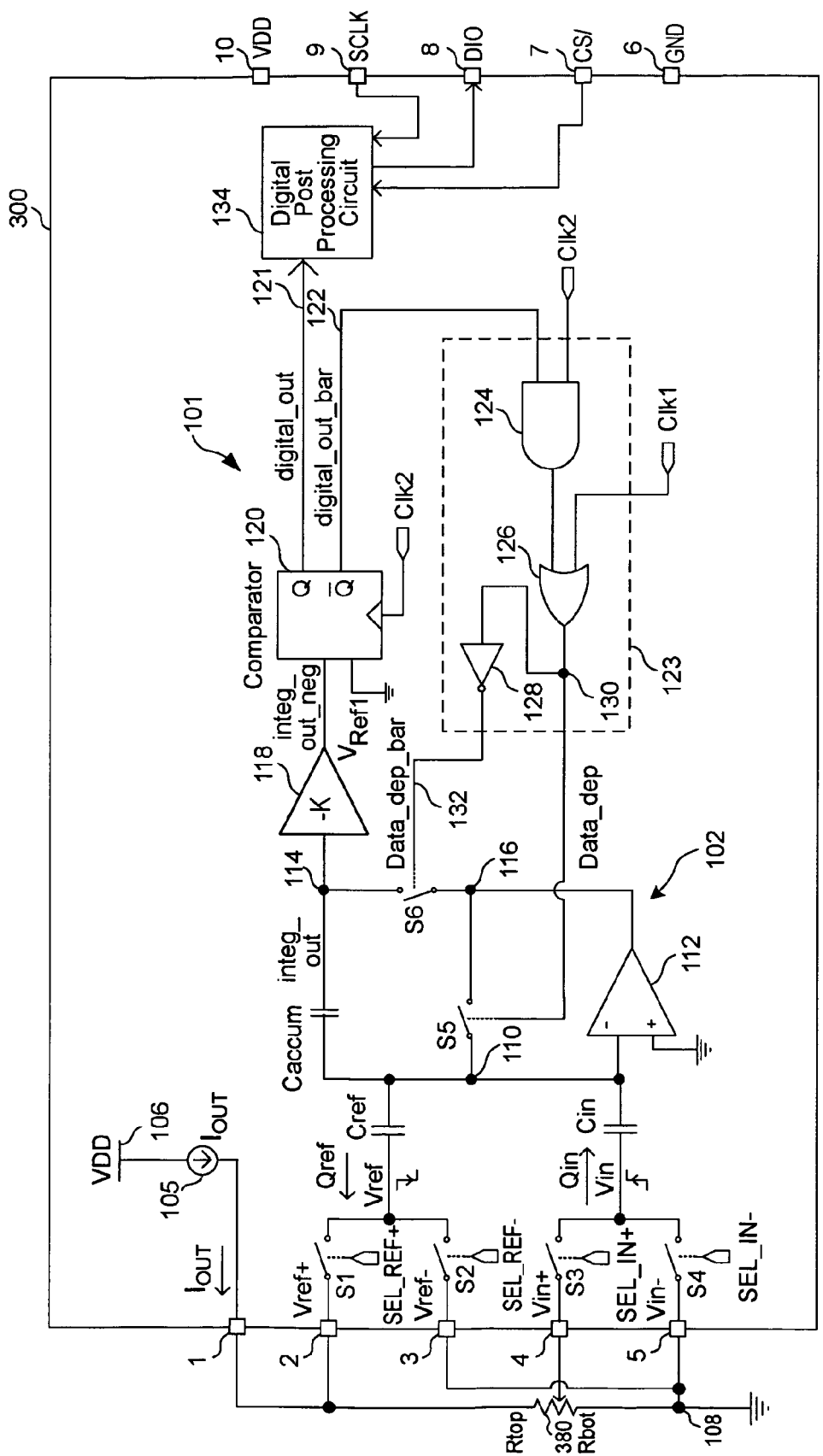
FIG. 5 is a schematic diagram of a ratiometric digitizing ohmmeter system configured to measure the position of the adjustable wiper of the potentiometer by measuring the ratio Rbot/(Rtop+Rbot) according to one embodiment of the invention.

FIG. 5 is a schematic diagram of a ratiometric digitizing ohmmeter system configured for measuring the resistance ratio corresponding to the wiper position of a potentiometer according to one embodiment of the present invention. The wiper position relates to resistance value Rbot while the total resistance of a potentiometer is indicated by the resistance value (Rtop+Rbot) where the total resistance (Rtop+Rbot) is not necessarily known a priori according to one embodiment of the present invention.

In the configuration shown in FIG. 5, the ratiometric digitizing ohmmeter system 300 is configured as a system with a serial interface controlled as a slave to the external reading system assumed to be coupled to pins 7, 8 and 9 in the same manner as in FIG. 4. Like reference numerals are used to refer to like elements in FIGS. 4 and 5 to simplify the discussion.

Referring to FIG. 5, a potentiometer 380 is coupled between pin 2 and pin 5 of system 300. Potentiometer 380 has two variable internal resistances defined as "Rtop" between the top terminal and the wiper and "Rbot" between the wiper and the bottom terminal of the potentiometer. The total value of resistance between the top terminal of potentiometer 380 and the bottom terminal is given by Rtotal=Rtop+Rbot. A resistance output terminal at the wiper of the potentiometer 380 defines the common terminal shared by the series resistors Rtop and Rbot. The resistance between the wiper terminal of potentiometer 380 and its bottom terminal is Rbot and is connected to pin 4 of system 300 and is the resistance to be measured. Pin 1 is connected to direct the DC excitation current to the top terminal of the potentiometer. Pin 2 is connected to the top terminal and pin 3 is connected to the bottom terminal of the potentiometer to use the resistance across the entire potentiometer (Rtotal=Rtop+Rbot) as the reference resistance. Pin 5 is connected to the bottom terminal of the potentiometer to choose Rbot as the external resistance to be measured. The lower terminal of the potentiometer (node 108) and pin 3 and pin 5 is connected to the ground voltage.

As thus configured, the ratiometric digitizing ohmmeter system 300 uses Rext=Rbot and Rref=(Rtop+Rbot) and thus measures the ratio Rbot/(Rtop+Rbot). This ratio is indicative of the wiper position regardless of uniform changes to Rtop and Rbot due to temperature or aging. The potentiometer total resistance does not need to be precise or accurate or even known (subject only to the constraint of not exceeding a maximum resistance value which could cause clipping at the integrator output). Potentiometer wiper position can be an indirect measurement of position (for linear potentiometer displacement sensors) or of desired control value (such as volume controls for audio equipment). Thus the system of FIG. 5 can be used to precisely measure these indirect parameters without the use of any highly accurate or precise or potentially expensive circuit elements.

4-Wire Remote Resistive Thermal Device (RTD)

Figure 6:
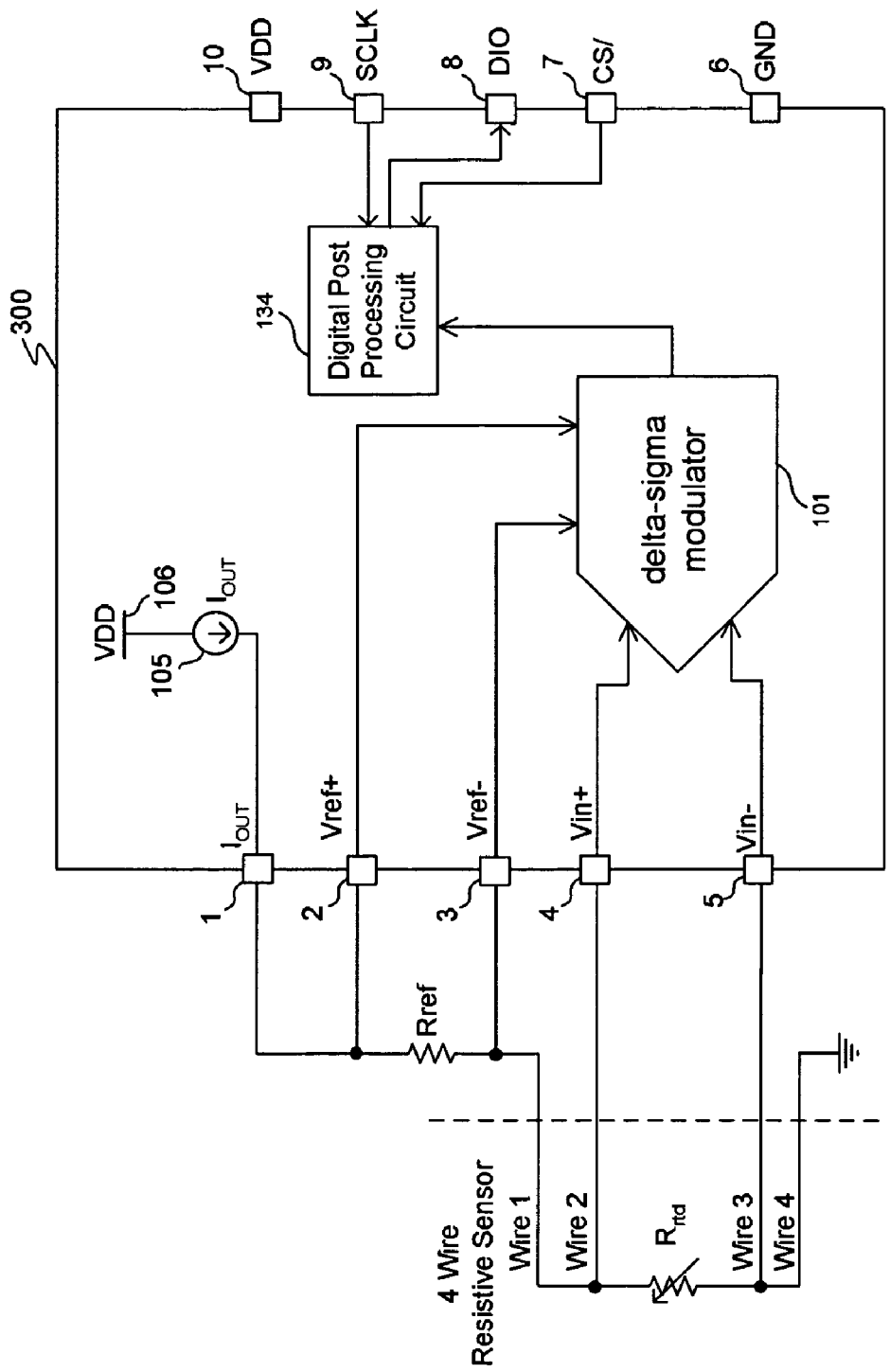
FIG. 6 illustrates the coupling of a 4-wire remote resistive sensor to the ratiometric digitizing ohmmeter system of the present invention according to one embodiment of the present invention.

The ratiometric digitizing ohmmeter system of the present invention can be used with a 4-wire remote resistive sensor such as a platinum film resistive thermal device (RTD). FIG. 6 illustrates the coupling of a 4-wire remote resistive thermal device (RTD) to the ratiometric digitizing ohmmeter system of the present invention according to one embodiment of the present invention. In the configuration shown in FIG. 6, the ratiometric digitizing ohmmeter system 300 is configured as a system with a serial interface controlled as a slave to the external reading system assumed to be coupled to pins 7, 8 and 9 in the same manner as in FIG. 4. Like reference numerals are used to refer to like elements in FIGS. 4 and 6 to simplify the discussion.

The reference resistor $R_{ref}$ is first connected to pin 1 of system 300 to receive the forced current $I_{OUT}$. Pin 2 is connected to this terminal to sense voltage Vref+. The other terminal of resistor $R_{ref}$ is connected to wire 1 which will force the same current $I_{OUT}$ through resistor $R_{rtd}$. Pin 3 is connected to wire 1 in close proximity to resistor $R_{ref}$ in order to sense the voltage Vref−.

The 4-wire remote resistive thermal device, denoted as $R_{rtd}$, is coupled to ratiometric digitizing ohmmeter system 300 as follows. The 4-wire remote RTD is connected across a pair of force terminals (wire 1 and wire 4) and a pair of sense terminals (wire 2 and wire 3). Force wire 1 of device $R_{rtd}$ is connected to resistor $R_{ref}$ at the same terminal monitored by pin 3. Force wire 4 at the second terminal of device $R_{rtd}$ is connected to the ground potential. In this manner, the DC excitation current supplied to reference resistor $R_{ref}$ passes through device $R_{rtd}$. Sense wire 2 at the first terminal of device $R_{rtd}$ is connected to pin 4 for providing the positive Vin+ voltage. Sense wire 3 at the second terminal of device $R_{rtd}$ is connected to pin 5 to sense the Vin− voltage. As thus configured, the digitizing ohmmeter system of the present invention is disposed to measure the ratio of the resistance of device $R_{rtd}$ to the resistance of $R_{ref}$ and provide a digital output value indicative of the resistance and hence the temperature measured by the resistive thermal device.

In the present embodiment, device $R_{rtd}$ is a platinum 1 kOhm device with a temperature range of −200 to 630° C. Resistor $R_{ref}$ has a resistance value of 3.4 kohms. The reference voltage is 204 mV, which defines the fullscale range of the ADC in the voltage domain. The resistance range of device $R_{rtd}$ is between 0.185 k to 3.23 k Ohms and the actual voltage range dropped across device $R_{rtd}$ is about 183 mV. Thus, the resistive thermal device $R_{rtd}$ uses up to 89% of the ADC fullscale range of the digitizing ohmmeter system.

RTD with Hyperbolic Linearity Correction

Figure 7:
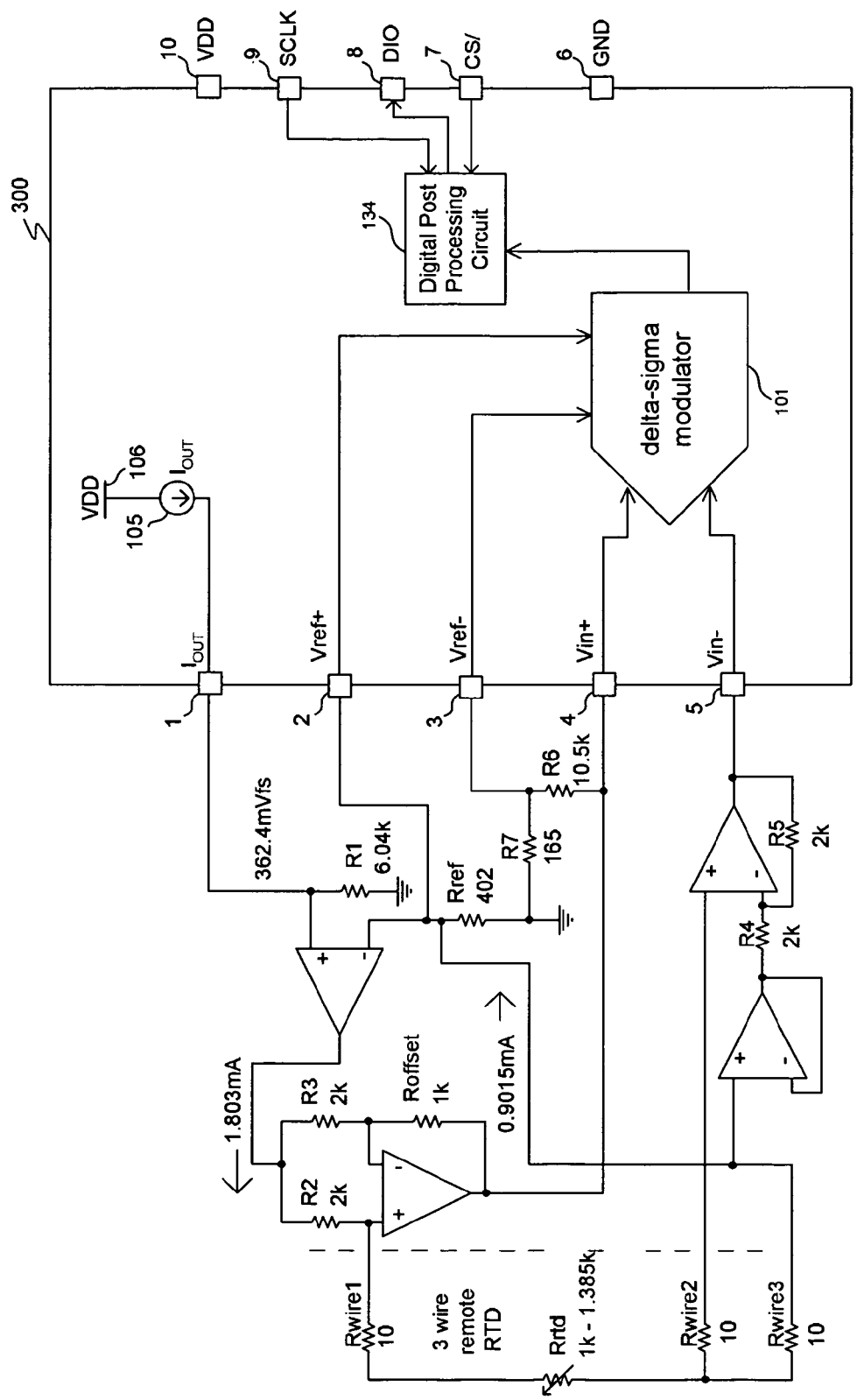
FIG. 7 is a schematic diagram of a ratiometric digitizing ohmmeter system configured for measuring a linearized signal related to the temperature of a platinum film resistive thermal device (RTD), which signal changes with changes to the resistance of the resistive thermal device.

The ratiometric digitizing ohmmeter system of the present invention can be used in applications where hyperbolic linearity correction is used to linearize the nonlinear change in resistance at some types of sensors in response to their stimulus. FIG. 7 illustrates a remote resistive thermal device (RTD) where hyperbolic correction circuitry is coupled to the ratiometric digitizing ohmmeter system 300 to linearize the resistance change of the RTD device vs. temperature in order to obtain a more accurate indirect measurement of the temperature at the remote RTD. The application circuit shown in FIG. 7 also discloses methods to externally increase the output current and to center the fullscale range of the ohmmeter at a given offset resistance. The circuit further discloses one method to compensate for voltage drops in external wiring when using this external offset method.

In the embodiment shown in FIG. 7, a 3-wire remote RTD, denoted as device $R_{rtd}$, is used. Hyperbolic correction is obtained by adding a fraction (about 1.55%) of the input signal to the Vref− voltage. The resistance values for resistors R6 and R7 are selected to provide hyperbolic correction. When this form of linearization is used, the measurement becomes more linear with respect to the applied stimulus, but the offset and gain of the system will be adversely affected in proportion to the amount of linearizing correction required. Offset and gain adjustment may be required by the user. In the preferred embodiment of system 300 this offset and gain adjustment can be accomplished by modification of the digital gain and offset trim values in the digital post processing circuit 134.

Thermistor Application

Figure 8:
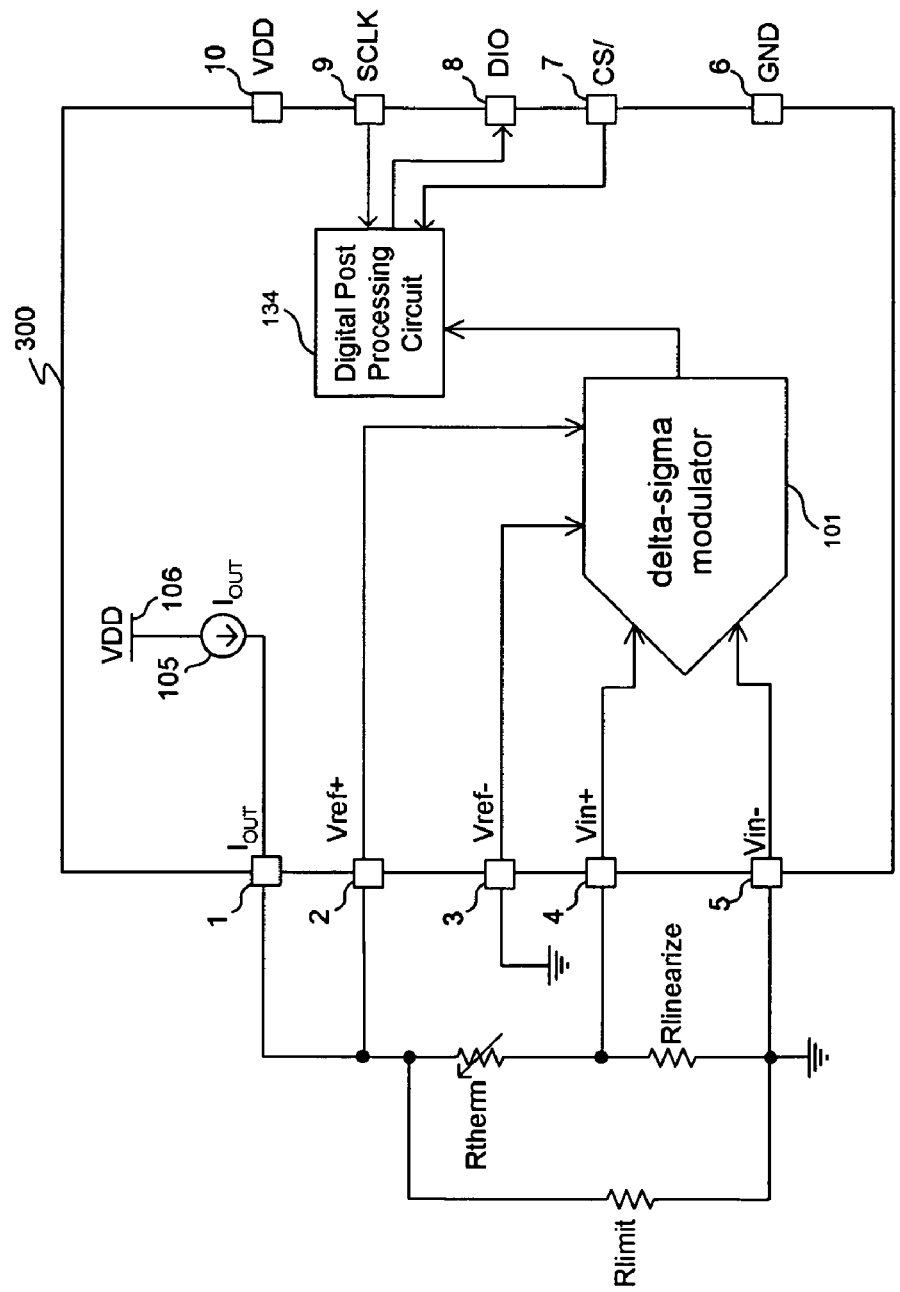
FIG. 8 illustrates a method of coupling a negative temperature coefficient thermistor resistive sensor to the ratiometric digitizing ohmmeter system of the present invention according to one embodiment of the present invention.

The ratiometric digitizing ohmmeter system of the present invention can also be used with a thermistor. FIG. 8 is a schematic diagram of a ratiometric digitizing ohmmeter system configured for measuring a linearized signal related to the temperature of the thermistor, which signal changes with changes to the resistance of the thermistor.

Referring to FIG. 8, a 10 k Ohm NTC thermistor, denoted as $R_{therm}$, having a 10 k Ohm resistance at 25° C. and exhibiting a negative temperature coefficient is used. The resistance of an NTC thermistor decreases with increasing temperature. In order to measure a signal which is more indicative of the temperature than the resistance of the thermistor, this circuit measures the voltage drop across the stable resistor $R_{linearize}$ which increases as temperature increases. Thus the ones density and output code of system 300 increases as temperature increases, while the resistance of thermistor $R_{therm}$ decreases.

The resistor $R_{linearize}$ is connected across the two input pins 4 and 5 of digitizing ohmmeter system 300. The series connection of $R_{linearize}+R_{therm}$ is connected across the reference inputs at pins 2 and 3. These resistors are coupled to digitizing ohmmeter system 300 of the present invention in a manner so as to allow the digitizing ohmmeter system to measure the Ratio=$R_{linearize}/(R_{linearize}+R_{therm})$ and to provide a digital output value indicative thereof.

Pin 5 of system 300 is also connected to the ground voltage. Resistor $R_{linearize}$ is used to linearize the voltage indicative of the temperature of the thermistor, over a limited temperature range of interest, whose response without such a resistor is typically logarithmic. A resistor $R_{limit}$ is coupled between pin 2 and pin 3, where pin 3 is also connected to the ground potential of system 300. Resistor $R_{limit}$ is used limit the magnitude of the differential reference voltage Vref to a voltage below the maximum where clipping at the output of the integrator might occur. $R_{limit}$ does not affect the linearity of the signal to be digitized and in general does not need to be of high stability or accuracy. The value of $R_{limit}$ should be chosen as the highest value resistance which will keep the voltage between pin 2 and pin 3 below a maximum limit at the coldest temperature within the temperature range of interest. In the present embodiment, the maximum (Vref+− Vref−) voltage is around 0.36 volts. Finally, pin 1 is coupled to the node common to $R_{therm}$ and $R_{limit}$ to couple the DC excitation current $I_{OUT}$ to the node common to the thermistor and the voltage limiting resistances.

In the present embodiment, $I_{OUT}$ is 60 uA, thermistor $R_{therm}$ has a resistance value between 1.7 kohms to 32 kohms over a temperature range of 0 to 70° C., resistor $R_{linearize}$ has a resistance value of 5.11 kohms and resistor $R_{limit}$ has a resistance value of 6.04 kohms.

System Characteristics and Advantages

The ratiometric digitizing ohmmeter system of the present invention provides many advantages over conventional resistance measurement systems.

First, the ratiometric digitizing ohmmeter system of the present invention employs current drive as the excitation source instead of voltage drive. It is well known that using current drive results in an input voltage which is inherently more linear than voltage drive for resistive input sensors whose resistance changes while configured in a full or half-Wheatstone bridge configuration. FIGS. 9A and 9B are schematic diagrams of a variable resistance sensor configured in a half-Wheatstone bridge (voltage divider) configuration with a high impedance current source excitation (FIG. 9A) and with a low impedance voltage source excitation (FIG. 9B). FIG. 9C is a plot of the Vin voltage as the resistance of the variable resistance sensor increases from 500 Ohms to 1 kOhms for the resistance sensor configurations in FIGS. 9A and 9B.

Figure 10:
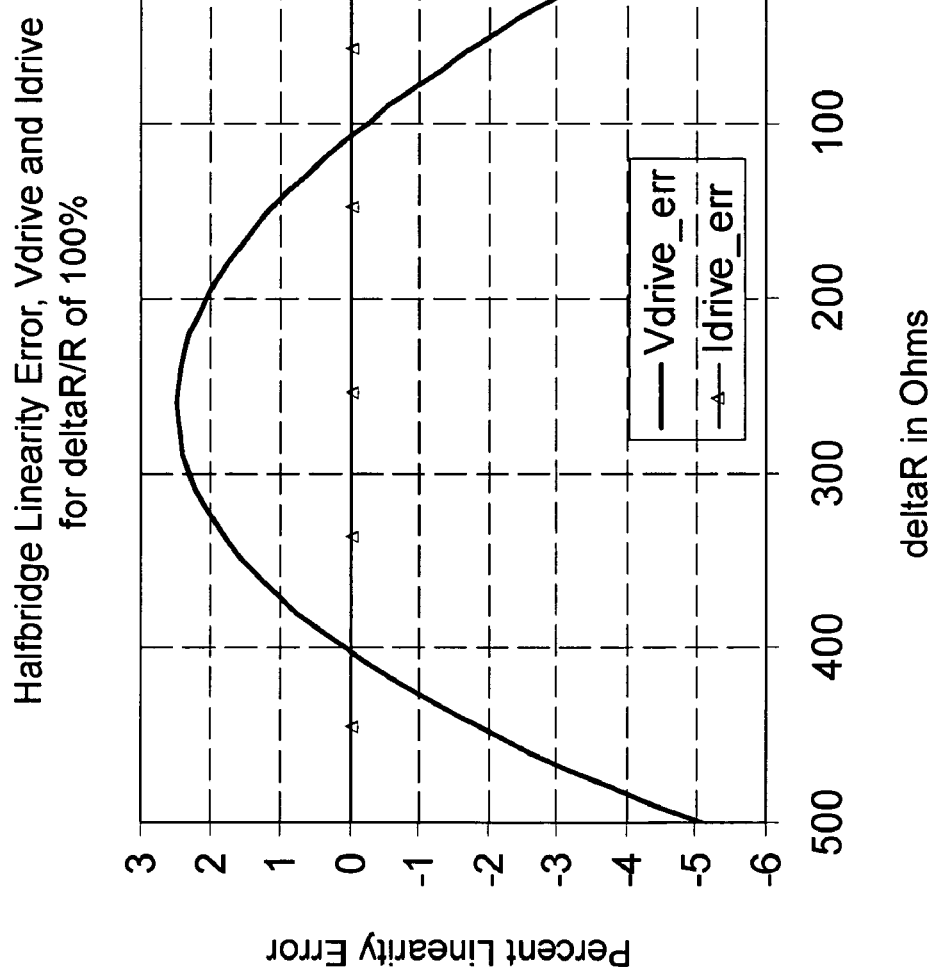
FIG. 10 is a plot of the linearity error in percent of Vin after a best-fit line has been subtracted for the two resistance sensor configurations of FIGS. 9A and 9B.

As the variable resistor increases from 500 Ohms to 1 kOhm, the voltage at node Vin changes for both circuits. The voltage Vin of the current source driven circuit rises linearly from 0.5 Volts to 1 Volt as shown in FIG. 9C. The voltage Vin at the voltage driven circuit rises non-linearly from 0.5 Volts to 0.75 Volts for the same change in resistance as in FIG. 9C. FIG. 10 is a plot of the linearity error in percent of Vin after a best-fit line has been subtracted for the two resistance sensor configurations of FIGS. 9A and 9B. The current source driven circuit (FIG. 9A) shows no systematic linearity error. The voltage driven circuit (FIG. 9B) shows −5% to +2.5% linearity errors. Thus, the digitizing ohmmeter system of the present invention can provide more accurate results than conventional systems using voltage drive for resistive sensors arranged in this common configuration.

A second advantage of the digitizing ohmmeter system of the present invention is that unlike conventional resistance measurement systems, a precise current source or a precise voltage source is not needed to ensure precise resistance measurements. In the digitizing ohmmeter system of the present invention, highly accurate resistance measurements can be made using a not-necessarily precise DC reference current. Specifically, the not-necessarily precise DC reference current is used to excite both the resistance to be measured and the stable reference resistance. The voltage drops resulted from the DC reference current $I_{OUT}$ are:

$$V_{Rext} = I_{OUT}R_{ext}, \quad V_{Rref} = I_{OUT}R_{ref}. \quad \text{Eq. (6)}$$

The voltage drop across the resistance to be measured ($R_{ext}$) is compared to the voltage drop across the stable reference resistance ($R_{ref}$) to determine the value of the unknown resistance. The charge balancing ADC inherently reports a digital output which is the ratio of Vin to Vref. Within normal operating limits the varying effect of the DC current $I_{OUT}$ exactly cancels and the output code is independent of changes in current $I_{OUT}$:

$$ADC_{\text{digital\_out}} = \frac{V_{in}}{V_{ref}} = \frac{I_{OUT}R_{ext}}{I_{OUT}R_{ref}} = \frac{R_{ext}}{R_{ref}}. \quad \text{Eq. (7)}$$

A third advantage of the digitizing ohmmeter system of the present invention concerns its ability to reject and filter noise. The current $I_{OUT}$ may contain ac current noise components. Such current noise will also cause proportional short term increases and decreases in voltages Vin and Vref. The system samples the voltage across $R_{ref}$ and $R_{ext}$ in adjacent time slots. Current noise of low frequency will persist over the time interval between charge packet accumulations and will thus also be cancelled in the manner of described above by the nature of the system. Higher frequency noise currents will not be cancelled, but will be reduced by the effective averaging of the noisy Vin samples over the multiple samples used to perform a single measurement. Thus the digitized output measurement is largely immune to current noise within $I_{OUT}$.

A fourth advantage of the digitizing ohmmeter system of the present invention concerns the power supply voltage variation rejection of the measurement circuit and method. It is well known that using a high impedance source (a current source) to drive a resistance to ground results in a voltage drop across that resistor which is insensitive to supply voltage variations in the current generator circuit. Large variations of generated current with supply voltage could cause input or reference voltages to exceed the desired maximum voltages at these differential inputs and cause clipping at the output of the integrator in the modulator. Thus the digitizing ohmmeter of the present invention can operate to higher accuracy over larger power supply variations than systems which use a resistor to the positive voltage supply as the excitation source.

A fifth advantage of the digitizing ohmmeter system of the present invention is that the digitizing ohmmeter system uses a resistance, not a voltage or a current, as its stable reference circuit. In general, it is necessary to use resistors as one of multiple components within a voltage reference or within a current reference circuit. Obtaining stability over time and temperature of a voltage or current reference which internally contains resistors that is better than the stability of the resistors themselves requires complicated compensation circuitry and usually requires measurement and trimming during the manufacturing process. The use of a single reference resistor can thus result in smaller accuracy and stability errors than the use of a voltage reference circuit or current reference circuit as such errors are caused by only a single component. Metal foil reference resistors of exceptional accuracy and stability are available from manufacturers such as Vishay and Wilbrecht. As an example, the Vishay VHP100 series of resistors is specified to remain within a window of +/−30 parts per million over the applied temperature of −55 to +125° C. A bandgap voltage reference of 1.22 Volts would have to remain within a window of +/−37 uV over the same temperature range in order to match this temperature stability. Applications which require low noise and high resolution, but not necessarily high stability and accuracy, can use lower accuracy reference resistors for monetary savings.

A sixth advantage of the digitizing ohmmeter system of the present invention is the optional availability of user-programmable system digital gain trim. The digitizing ohmmeter system optionally utilizes a user initiated calibration to determine small gain and offset trim values which trim values are applied to adjust the absolute accuracy of measurements. When calibration is performed for the digitizing ohmmeter system of the present invention in which a reference resistor is used, the reference resistor is only required to maintain a stable resistance value, and does not need to be of a precise value. The use of calibration can thus result in monetary savings as high stability reference resistors of precise value are more expensive than high stability resistors of less precise value.

A seventh advantage of the digitizing ohmmeter system of the present invention is the low kT/c noise generated at the switched capacitors Cin and Cref. The switched capacitor input circuit of the present invention is configured to minimize kT/C noise events, which occur when a switch is opened and a noise charge is held on the capacitor. One kT/c noise event occurs when the Vin side of the capacitor Cin is momentarily open circuited while being switched from Vin− to Vin+. A second kT/C noise event occurs when the capacitor is switched back to Vin− before the start of the next cycle. This second noise event occurs while the amplifier is shorted input to output in its correlated double sampling phase. This noise event is not transferred to the accumulation capacitor and thus does not contribute to noise in the digitized measurement. Similarly, only one of two noise events at the reference switched capacitor are capable of affecting the digitized measurement. At the reference input, noise events are further reduced in number because the reference charge packet is only accumulated in proportion to the digital output number. Measurements of resistance much less than the reference resistor will incur proportionally many fewer reference noise events. Thus input signals near the middle of the fullscale range will incur approximately 1.5 kT/c noise events per modulator cycle. Other prior art delta-sigma ADC modulator topologies without correlated double sampling incur two input capacitor switching noise events per cycle independent of signal level. See, for example, Max Hauser and Robert Brodersen, "Circuit and Technology Considerations for MOS Delta-Sigma A/D Converters", IEEE Proc. ISCAS'86, pp. 1310-1315, May 1986; reprinted in "Oversampling Delta-Sigma Data Converters", edited by James Candy and Gabor Temes, IEEE Press, Piscataway, N.J., 1992. Some of the prior topologies which do implement correlated double sampling can cause up to four kT/C noise events per cycle. See, for example, K. Vleugels, S. Rabii and B. Wooley, "A 2.5V Sigma-Delta Modulator for Broadband Communications Applications", IEEE Journal of Solid-State Circuits, vol. 36, no. 12, pp. 1889-1890, December 2001.

An eighth advantage of the digitizing ohmmeter system of the present invention is that, because the switched capacitor input stage of the ADC generates very little noise and the charge balancing of the modulator is of high precision, the system can measure to high accuracy and precision at very small reference voltages, where the reference voltage is the voltage between Vref− and Vref+. The differential voltage between Vref− and Vref+ is given by the voltage drop $I_{OUT}*R_{ref}$. The fullscale range of this system can be made very small by choosing a small value for the external reference resistor $R_{ref}$ or by choosing a small value (in microAmperes) for the DC excitation current $I_{OUT}$. When the system is configured for a very small fullscale range (tens of millivolts) external amplification of the input sensor signal in many applications can be drastically reduced or eliminated altogether. Amplification of the input sensor signal is often required when using conventional ADCs, which typically require a reference voltage that is a multiple of 1.22 Volts and input signals amplified to that level. Such amplification introduces undesirable noise, offset and gain errors and requires extra circuitry which needs more power and more area to implement.

A ninth advantage of the digitizing ohmmeter system of the present invention concerns the differential nature of the input and reference signals. By using differential input and reference signals at the input stage of the digitizing ohmmeter system, and by using the excitation current flowing through the reference resistor as a forcing current to the external resistive input sensor, force/sense connections can be established at the external input sensor. FIG. 6 illustrates a 4-wire force/sense circuit which measures the resistance of an external resistive sensor. The resistance of the wiring and any connectors between the system and the sensor is rejected by the system and does not contribute significant error to the resistance measurement. Another benefit of the differential input and reference is that it is easier to choose circuit nodes for the reference and input which linearize the digital output of different types of nonlinear input sensors because such nodes usually do not include the ground reference node.

Furthermore, the digitizing ohmmeter system of the present invention can be used to measure the resistance of an input sensor that is physically located at a distance away from the digitizing ohmmeter system. In other resistance measurement systems where current pulsing or AC current is used as the excitation source, the resistance to be measured must be physically located within a few inches of the measurement system. This is because the long wires used to connect the input sensor to the input terminals of the resistance measurement system introduce unavoidable parasitic capacitances and inductances that degrade the measurement.

The above detailed descriptions are provided to illustrate specific embodiments of the present invention and are not intended to be limiting. Numerous modifications and variation within the scope of the present invention are possible. The present invention is defined by the appended claims.

I claim:

1. A method for sampling and digitizing a resistance ratio measurement from an impedance-varying input sensor, comprising:

connecting said input sensor and a reference resistor in series between a first node and a second node;

applying a DC excitation current from a high impedance current source to said input sensor and said reference resistor;

sampling the voltage across said input sensor using a first pair of switches, said first pair of switches being controlled by complementary signals so that only one switch of the first pair of switches is closed at a time;

generating an input voltage step having a magnitude corresponding to said voltage across said input sensor by the switching action of said first pair of switches, said input voltage step being indicative of the resistance of said input sensor;

sampling the voltage across said reference resistor using a second pair of switches, said second pair of switches being controlled by complementary signals so that only one switch of the second pair of switches is closed at a time;

generating a reference voltage step having a magnitude corresponding to said voltage across said reference resistor by the switching action of said second pair of switches, said reference voltage step being indicative of the resistance of said reference resistor;

coupling said input voltage step to an integrator;

integrating charges corresponding to a transition of said input voltage step on an accumulation capacitor;

coupling said reference voltage step to said integrator;

generating a data dependent signal for deactivating or activating said integrator;

integrating charges associated with a transition of said reference voltage step when said data dependent signal has a first value or disregarding charges associated with the transition of said reference voltage step when said data dependent signal has a second value, said transition of said reference voltage step being opposite to said transition of said input voltage step;

comparing a signal corresponding to said charges accumulated on said accumulation capacitor with a reference level; and generating an output signal as a result of said comparing, said data dependent signal having said first value and said second value corresponding to respective logical levels of said output signal, wherein after a plurality of sampling cycles, said output signal forms a digital data stream having an ones density proportional to a ratio of the resistance of said input sensor to said reference resistor.

2. The method of claim 1, further comprising:

in response to a first signal, deactivating said integrator and operating said integrator in a correlated double sampling mode, said deactivating and operating comprising:

shorting out an amplifier in said integrator; and storing an amplifier error voltage onto input and reference capacitors of said integrator, said amplifier error voltage comprising an amplifier offset voltage, 1/f noise and wideband amplifier noise.

3. The method of claim 1, wherein said comparing comprises:

coupling an inverting buffer to said accumulation capacitor;

generating at said inverting buffer a voltage corresponding to an inverted voltage value corresponding to said charges accumulated on said accumulation capacitor; and comparing said voltage at said inverting buffer with said reference level.

4. The method of claim 1, wherein said transition of said input voltage step comprises a rising edge of said input voltage step and said transition of said reference voltage step comprises a falling edge of said reference voltage step.

5. The method of claim 1, wherein said transition of said input voltage step comprises a falling edge of said input voltage step and said transition of said reference voltage step comprises a rising edge of said reference voltage step.

6. The method of claim 1, further comprising:

counting occurrences of ones in said digital data stream over a plurality of sampling cycles and generating a count value; and subtracting an offset value from said count value to generate a resistance output value.

7. The method of claim 6, further comprising:

applying a first trim value to adjust a total number of sampling cycles for which said occurrences of ones are counted; and applying a second trim value to adjust the value of said offset value.

8. The method of claim 1, wherein the resistance ratio to be measured comprises a potentiometer and connecting said input sensor and a reference resistor in series between a first node and a second node comprises:

connecting said potentiometer between said first node and said second node, the full resistance range of said potentiometer being coupled to function as said reference resistor and a resistance output terminal of said potentiometer being coupled as said input sensor.

* * * * *